(12) United States Patent
Ogi et al.

(10) Patent No.: US 11,322,539 B2
(45) Date of Patent: May 3, 2022

(54) SEMICONDUCTOR DEVICE AND MANUFACTURING METHOD, AND ELECTRONIC APPLIANCE

(71) Applicant: SONY CORPORATION, Tokyo (JP)

(72) Inventors: Jun Ogi, Kanagawa (JP); Junichiro Fujimagari, Kanagawa (JP); Susumu Inoue, Kanagawa (JP); Atsushi Fujiwara, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/891,995

(22) Filed: Jun. 3, 2020

(65) Prior Publication Data

US 2020/0295071 A1    Sep. 17, 2020

Related U.S. Application Data

(63) Continuation of application No. 16/242,764, filed on Jan. 8, 2019, now Pat. No. 10,707,259, which is a continuation of application No. 15/546,138, filed as application No. PCT/JP2016/000932 on Feb. 22, 2016, now Pat. No. 10,199,419.

(30) Foreign Application Priority Data

Mar. 5, 2015 (JP) ................ 2015-043553

(51) Int. Cl.
*H01L 31/18*    (2006.01)
*H01L 27/146*   (2006.01)
*H01L 23/00*    (2006.01)

(52) U.S. Cl.
CPC ........ *H01L 27/14636* (2013.01); *H01L 24/16* (2013.01); *H01L 24/48* (2013.01); *H01L 27/1469* (2013.01); *H01L 27/14627* (2013.01); *H01L 27/14632* (2013.01); *H01L 27/14634* (2013.01); *H01L 27/14645* (2013.01); *H01L 27/14685* (2013.01); *H01L 27/14687* (2013.01); *H01L 2224/16145* (2013.01);
(Continued)

(58) Field of Classification Search
CPC ............... H01L 27/146; H01L 27/1469; H01L 27/14632; H01L 27/14636; H01L 27/14627; H01L 27/14645; H01L 27/14687; H01L 27/14685; H01L 27/14634; H01L 23/00; H01L 24/16; H01L 24/48; H01L 2924/146; H01L 2924/18161; H01L 2224/16145; H01L 2224/48463; H01L 27/326; H01L 27/3248; H01L 27/14605; H01L 31/02; H01L 31/18; H01L 31/0232
USPC ........................................ 257/432
See application file for complete search history.

(56) References Cited

U.S. PATENT DOCUMENTS

2015/0137358 A1* 5/2015 Yanagisawa ............ H01L 21/78
                                                    257/737
2015/0365567 A1* 12/2015 Umebayashi .......... H04N 5/379
                                                    348/308

* cited by examiner

*Primary Examiner* — Chuong A Luu
(74) *Attorney, Agent, or Firm* — Sheridan Ross P.C.

(57) ABSTRACT

There is provided a semiconductor device including: a plurality of bumps on a first semiconductor substrate; and a lens material in a region other than the plurality of bumps on the first semiconductor substrate, wherein a distance between a side of a bump closest to the lens material and a side of the lens material closest to the bump is greater than twice a diameter of the bump closest to the lens material, and wherein the distance between the side of the bump closest to the lens material and the side of the lens material closest to the bump is greater a minimum pitch of the bumps.

11 Claims, 20 Drawing Sheets

(52) U.S. Cl.
CPC ............... *H01L 2224/48463* (2013.01); *H01L 2924/146* (2013.01); *H01L 2924/18161* (2013.01)

SEMICONDUCTOR DEVICE AND MANUFACTURING METHOD, AND ELECTRONIC APPLIANCE

CROSS REFERENCE TO RELATED APPLICATIONS

This application is a continuation of U.S. patent application Ser. No. 16/242,764, filed Jan. 8, 2019, which is a continuation of U.S. patent application Ser. No. 15/546,138, filed Jul. 25, 2017, now U.S. Pat. No. 10,199,419, which is a national stage application under 35 U.S.C. 371 and claims the benefit of PCT Application No. PCT/JP2016/000932 having an international filing date of Feb. 22, 2016, which designated the United States, which PCT application claimed the benefit of Japanese Patent Application No. 2015-043553 filed Mar. 5, 2015, the disclosures of which are incorporated herein by reference in their entirety.

TECHNICAL FIELD

The present disclosure relates to a semiconductor device and a manufacturing method, and an electronic appliance, and particularly relates to a semiconductor device and a manufacturing method, and an electronic appliance that make it possible to perform bonding of semiconductor chips easily.

BACKGROUND ART

A technology of electrically connecting semiconductor chips by flip-chip bonding using bumps to allow connection portions to have multiple pins and lower capacity and increase the speed of data exchange between the semiconductor chips, as compared with connection using wire bonding in related art, has been devised (e.g., see PTL 1).

As an application of this technology, there is a technology of stacking a peripheral circuit on the light collection surface side of a surface type solid-state imaging device by flip-chip bonding. Performing flip-chip bonding on the light collection surface side of the surface type solid-state imaging device demands formation of bumps on the light collection surface. However, a light collection structure called on-chip lenses is formed on the light collection surface, and a lens material of an organic substance or the like that forms these on-chip lenses is stacked on the entire light collection surface including a peripheral circuit region as well as a pixel region. Therefore, to connect the bumps to electrode pads for bump connection formed on a semiconductor substrate, openings are made in the lens material and the bumps are formed on the openings.

In this case, the depth of the opening is increased by the thickness of the lens material, which makes it difficult to form the bumps with high precision. This applies not only to a solid-state imaging device but also to an element that uses a resin such as polyimide as a protective film.

As described above, in the case where a lens material exists in a region where bumps are formed, bonding of semiconductor chips cannot be performed easily.

Meanwhile, there is a solid-state imaging device in which a first semiconductor chip where photoelectric conversion elements and electrodes for connection and the like are formed and a second semiconductor chip where an A/D conversion circuit, a signal processing circuit, a logical operation circuit, and the like and electrodes for collection are formed are stacked by being made to face each other and being bonded to each other with bumps.

The number of pixels of a solid-state imaging device used for a camera or the like is normally several millions to several tens of millions and thus a large number of electrodes for connection are necessary; the electrodes for connection are arranged with high density of a pitch of several tens of micrometers.

To accurately connect the electrodes for connection arranged with high density, it is necessary to arrange alignment marks on each of the first semiconductor chip and the second semiconductor chip, and perform bump bonding while performing alignment precisely on the basis of the alignment marks.

Methods for bump bonding include a chip-on-chip bonding method (e.g., see PTL 2) and a chip-on-wafer bonding method (e.g., see PTL 3). The chip-on-chip bonding method, which is a method of bonding semiconductor chips in units of semiconductor chips, has low bonding efficiency and is not suitable for mass production.

The chip-on-wafer bonding method is a method of bonding a plurality of second semiconductor chips to a semiconductor wafer where first semiconductor chips are arranged in a matrix. Although this method improves bonding efficiency as compared with the chip-on-chip bonding method, in the case where the second semiconductor chips are bonded to the semiconductor wafer one by one, time taken for bonding of each semiconductor wafer is lengthened in proportion to the number of the second semiconductor chips to be bonded. This not only leads to a decrease in throughput, but also lengthens time for heat treatment necessary for bump bonding and thus increases heat load on the semiconductor wafer.

In the case where a plurality of second semiconductor chips are collectively bonded to a semiconductor wafer, although the number of times of bonding per semiconductor wafer is reduced and thus time taken for bonding is shortened, a design constraint of making the semiconductor chips have an axis of symmetry by mirror inversion in advance is necessary (e.g., see PTLs 4 and 5). However, since a solid-state imaging device obtains image signals from a lens image projected on the first semiconductor chip, physical arrangement, such as north, south, east, and west, cannot be changed easily. That is, it is difficult to impose a design constraint such as mirror inversion. Accordingly, bonding of semiconductor chips cannot be performed easily.

CITATION LIST

Patent Literature

[PTL 1]
JP 2006-49361A
[PTL 2]
JP 2011-243612A
[PTL 3]
JP 2001-196528A
[PTL 4]
JP 2001-168383A
[PTL 5]
JP 2012-503884T

SUMMARY

Technical Problem

As described above, bonding of semiconductor chips has not been able to be performed easily.

The present disclosure, which has been made in view of this circumstance, makes it possible to perform bonding of semiconductor chips easily.

Solution to Problem

According to a first embodiment of the present disclosure, there is provided a semiconductor device including: a plurality of bumps on a first semiconductor substrate; and a lens material in a region other than the plurality of bumps on the first semiconductor substrate, wherein a distance between a side of a bump closest to the lens material and a side of the lens material closest to the bump is greater than twice a diameter of the bump closest to the lens material, and wherein the distance between the side of the bump closest to the lens material and the side of the lens material closest to the bump is greater a minimum pitch of the bumps.

An electronic appliance of the first embodiment of the present disclosure corresponds to the semiconductor device of the first embodiment of the present disclosure.

According to a second embodiment of the present disclosure, there is provided a method of manufacturing a semiconductor device comprising: forming a plurality of bumps on a first semiconductor substrate, and forming a lens material in a region other than the plurality of bumps on the first semiconductor substrate, wherein a distance between a side of a bump closest to the lens material and a side of the lens material closest to the bump is greater than twice a diameter of the bump closest to the lens material, and wherein the distance between the side of the bump closest to the lens material and the side of the lens material closest to the bump is greater a minimum pitch of the bumps.

According to a third embodiment of the present disclosure, there is provided a semiconductor device including: a first semiconductor substrate having a rectangular shape; a second semiconductor substrate having a rectangular shape, wherein an area of the second semiconductor substrate is less than an area of the first semiconductor substrate and at least a region of a first edge of the second semiconductor substrate is flush with at least a region of a first edge of the first semiconductor substrate; and a third semiconductor substrate having a rectangular shape. An area of the third semiconductor substrate is less than an area of the first semiconductor substrate and at least a region of a first edge of the third semiconductor substrate is flush with at least a region of a second edge of the first semiconductor substrate.

An electronic appliance of the third embodiment of the present disclosure corresponds to the semiconductor device of the third embodiment of the present disclosure.

In the third embodiment of the present disclosure, the first semiconductor substrate includes an array of pixels, the second and third semiconductor substrates each include at least one logic circuit. Each of the first edge of the first semiconductor substrate and the first edge of the second semiconductor substrate correspond to a scribe line forming a first edge of the stacked semiconductor device. Each of the second edge of the first semiconductor substrate and the first edge of the third semiconductor substrate correspond to a scribe line forming a second edge of the stacked semiconductor device.

According to a fourth embodiment of the present disclosure, there is provided a method of manufacturing a semiconductor device, the method comprising: bonding a first semiconductor substrate including a plurality of logic circuits to first and second semiconductor substrates arrayed in a semiconductor wafer, where each of the first and second semiconductor substrates includes a pixel array. The first semiconductor substrate spans the second and third semiconductor substrates. The method further includes cutting a first edge of the first semiconductor substrate and a first edge of the second semiconductor substrate such that the first edge of the first semiconductor substrate and the first edge of the second semiconductor substrate are flush with one another.

In the fourth embodiment of the present disclosure, a fourth semiconductor substrate including a plurality of logic circuits may be bonded to the second semiconductor substrate and a fifth semiconductor substrate, wherein the fourth semiconductor substrate spans the second and fifth semiconductor substrates. The method may further include cutting a second edge of the second semiconductor substrate and a first edge of the fourth semiconductor substrate such that the second edge of the second semiconductor substrate and the first edge of the fourth semiconductor substrate are flush with one another. In such an embodiment, a semiconductor device is created where the first edge of the first semiconductor substrate and the first edge of the second semiconductor substrate are flush with one another. Further, the second edge of the second semiconductor device and the first edge of the fourth semiconductor device may be flush with one another.

Advantageous Effects of Invention

According to the first and third embodiments of the present disclosure, bonding of semiconductor chips can be performed easily.

According to the second embodiment of the present disclosure, a semiconductor device that allows easy bonding of semiconductor chips can be manufactured.

Note that the effects described here are not necessarily limited, and any effect that is desired to be described in the present disclosure may be exhibited.

DESCRIPTION OF EMBODIMENTS

Hereinafter, modes (hereinafter called embodiments) for carrying out the present disclosure will be described. The description is given in the following order.
1. First embodiment: CMOS image sensor (FIGS. 1 to 13)
2. Second embodiment: CMOS image sensor (FIGS. 14 to 18)
3. Third embodiment: Imaging device (FIG. 19)
4. Usage example of CMOS image sensor (FIG. 20)

First Embodiment (Example Configuration of First Embodiment of CMOS Image Sensor)

Figure 1:
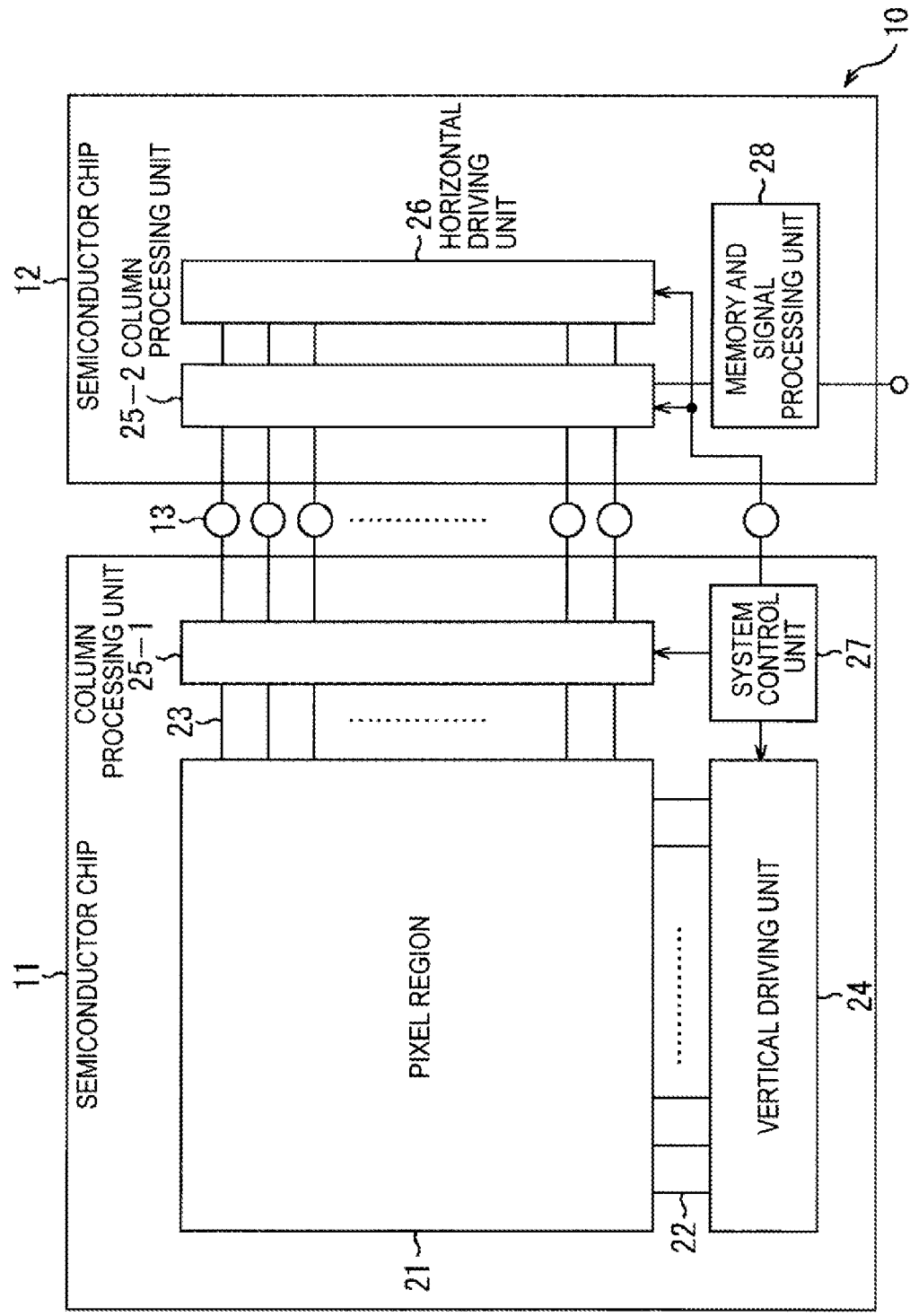
FIG. 1 is a block diagram illustrating an example configuration of a first embodiment of a CMOS image sensor as a semiconductor device to which the present disclosure is applied.

FIG. 1 is a block diagram illustrating an example configuration of a first embodiment of a complementary metal oxide semiconductor (CMOS) image sensor as a semiconductor device to which the present disclosure is applied.

A CMOS image sensor 10 includes a semiconductor chip 11 and a semiconductor chip 12 connected via bumps 13. The semiconductor chip 11 and the semiconductor chip 12 each include a semiconductor substrate, such as a silicon substrate, and a metal wiring layer of Cu, Al, or the like.

A pixel region 21, pixel driving lines 22, vertical signal lines 23, a vertical driving unit 24, a column processing unit 25-1, and a system control unit 27 are formed on the semiconductor chip 11. A column processing unit 25-2, a horizontal driving unit 26, and a memory and signal processing unit 28 are formed on the semiconductor chip 12.

In the pixel region 21, pixels each including a photoelectric conversion element that generates charge with a charge amount corresponding to a light amount of incident light and accumulates the charge inside are two-dimensionally arranged in a matrix to perform imaging. In addition, the pixel driving line 22 is formed in each row and the vertical signal line 23 is formed in each column for the pixels in the matrix in the pixel region 21.

The vertical driving unit 24 includes a shift register, an address decoder, or the like, and drives the pixels in the pixel region 21 in units of rows, for example. One terminal of the pixel driving line 22 is connected to an output terminal, which is not shown, corresponding to each row of the vertical driving unit 24. Although a specific configuration of the vertical driving unit 24 is not shown, the vertical driving unit 24 includes two scanning systems, a read scanning system and a sweep scanning system.

The read scanning system sequentially selects each row to sequentially read pixel signals from the pixels in units of rows, and outputs a selection signal or the like from the output terminal connected to the pixel driving line 22 of the selected row. Thus, from the pixels in the row selected by the read scanning system, electrical signals of charge accumulated in the photoelectric conversion elements are read as pixel signals and supplied to the vertical signal lines 23.

The sweep scanning system outputs a reset signal from the output terminal connected to the pixel driving line 22 of each row, earlier than the scanning by the read scanning system by a period of time corresponding to a shutter speed, in order to sweep (reset) unnecessary charge from the photoelectric conversion elements. By this scanning by the sweep scanning system, what is called electronic shutter operation is sequentially performed row by row. Here, electronic shutter operation refers to operation of discarding charge of photoelectric conversion elements and newly starting light exposure (starting accumulation of charge).

The column processing unit 25-1 is one part of signal processing circuits provided for the respective columns of the pixel region 21, and the column processing unit 25-2 is the other part. The column processing unit 25-1 and the column processing unit 25-2 are connected to each other via the bumps 13 to form the signal processing circuits provided for the respective columns of the pixel region 21. Each signal processing circuit performs signal processing, such as A/D conversion processing and correlated double sampling (CDS) processing, on pixel signals output from the pixels of the selected row through the vertical signal lines 23. Each signal processing circuit temporarily retains the pixel signals after the signal processing.

The horizontal driving unit 26 includes a shift register, an address decoder, or the like, and sequentially selects the signal processing circuit of each column. By this selection scanning by the horizontal driving unit 26, the pixel signals having been subjected to signal processing by each signal processing circuit are sequentially output to the memory and signal processing unit 28.

The system control unit 27 includes a timing generator, which generates various timing signals, or the like. The system control unit 27 generates control signals for controlling the vertical driving unit 24, the column processing unit 25-1, the column processing unit 25-2, and the horizontal driving unit 26, on the basis of the various timing signals generated by the timing generator.

The system control unit 27 supplies the control signal for controlling the vertical driving unit 24 to the vertical driving unit 24, and supplies the control signal for controlling the column processing unit 25-1 to the column processing unit 25-1. In addition, the system control unit 27 supplies the control signal for controlling the column processing unit 25-2 to the column processing unit 25-2 via the bump 13, and supplies the control signal for controlling the horizontal driving unit 26 to the horizontal driving unit 26 via the bump 13.

The memory and signal processing unit 28 performs various kinds of signal processing on the pixel signals output from the horizontal driving unit 26. At this time, the memory and signal processing unit 28 stores an intermediate result of signal processing, for example, in an internal memory as necessary, and refers to the intermediate result at necessary timing. The memory is configured with, for example, a dynamic random access memory (DRAM), a static random access memory (SRAM), or the like. The memory and signal processing unit 28 outputs the pixel signals after the signal processing.

(First Example Structure of CMOS Image Sensor)

FIG. 2A is a cross-sectional view illustrating a first example structure of the CMOS image sensor 10 of FIG. 1. FIG. 2B is a view of the first example structure of the CMOS image sensor 10, seen from the light irradiation side.

As illustrated in FIGS. 2A and 2B, the pixel region 21 and the like are formed on the semiconductor chip 11. In addition, in a region of the semiconductor chip 11 that corresponds to the semiconductor chip 12, a peripheral circuit unit 51 including the column processing unit 25-1 and the system control unit 27 is formed. Furthermore, electrode pads 52 for wire bonding are formed on the semiconductor chip 11.

Electrode pads 53A for bump connection are formed in the peripheral circuit unit 51. On the light irradiation side of the semiconductor chip 11, a passivation 54A of SiN or the like is formed to have openings in regions corresponding to the electrode pads 53A for bump connection and the electrode pads 52 for wire bonding. The bumps (micro-bumps) 13 are connected to the electrode pads 53A for bump connection via the openings of the passivation 54A.

Meanwhile, electrode pads 53B for bump connection are formed on (the column processing unit 25-2 of) the semiconductor chip 12. In addition, on the side opposite to the light irradiation side of the semiconductor chip 12, a passivation 54B of SiN or the like is formed to have openings in regions corresponding to the electrode pads 53B for bump connection. The bumps 13 are connected to the electrode pads 53B for bump connection via the openings of the passivation 54B. Thus, the semiconductor chip 12 is bonded to the light irradiation side of the semiconductor chip 11 via the bumps 13 on the semiconductor chip 12 and the bumps 13 on the semiconductor chip 11. That is, the semiconductor chip 12 is flip-chip bonded to the light irradiation side of the semiconductor chip 11.

To keep mechanical strength, a space between the semiconductor chip 11 and the semiconductor chip 12 is filled with an under-fill resin 55. Around a bonding region of the semiconductor chip 12 on the semiconductor chip 11, a dam 56 that prevents leakage of the under-fill resin 55 to a region other than the bonding region at the time of filling the space with the under-fill resin 55 is formed; thus, the under-fill resin 55 spreads only inside the dam 56.

In addition, on the light irradiation side of the semiconductor chip 11, a lens material 57 of an organic substance or the like is formed in the pixel region 21 of a region other than the bumps 13. The lens material 57 may include one kind of organic substance, or may include two or more kinds of organic substances stacked. A thin inorganic film of $SiO_2$, SiN, or the like may be stacked, as an antireflection film, on the organic substance forming the lens material 57.

The lens material 57 functions as on-chip lenses in the pixel region 21, and collects irradiation light on the pixel region 21. The lens material 57 is not formed in a region 58 other than the pixel region 21 on the semiconductor chip 11. That is, the lens material 57 has an opening in the region 58 other than the pixel region 21.

Note that, although not shown, a color filter and the like are actually formed between the lens material 57 and the pixel region 21.

(Description of Manufacturing Method of CMOS Image Sensor)

Figure 2:
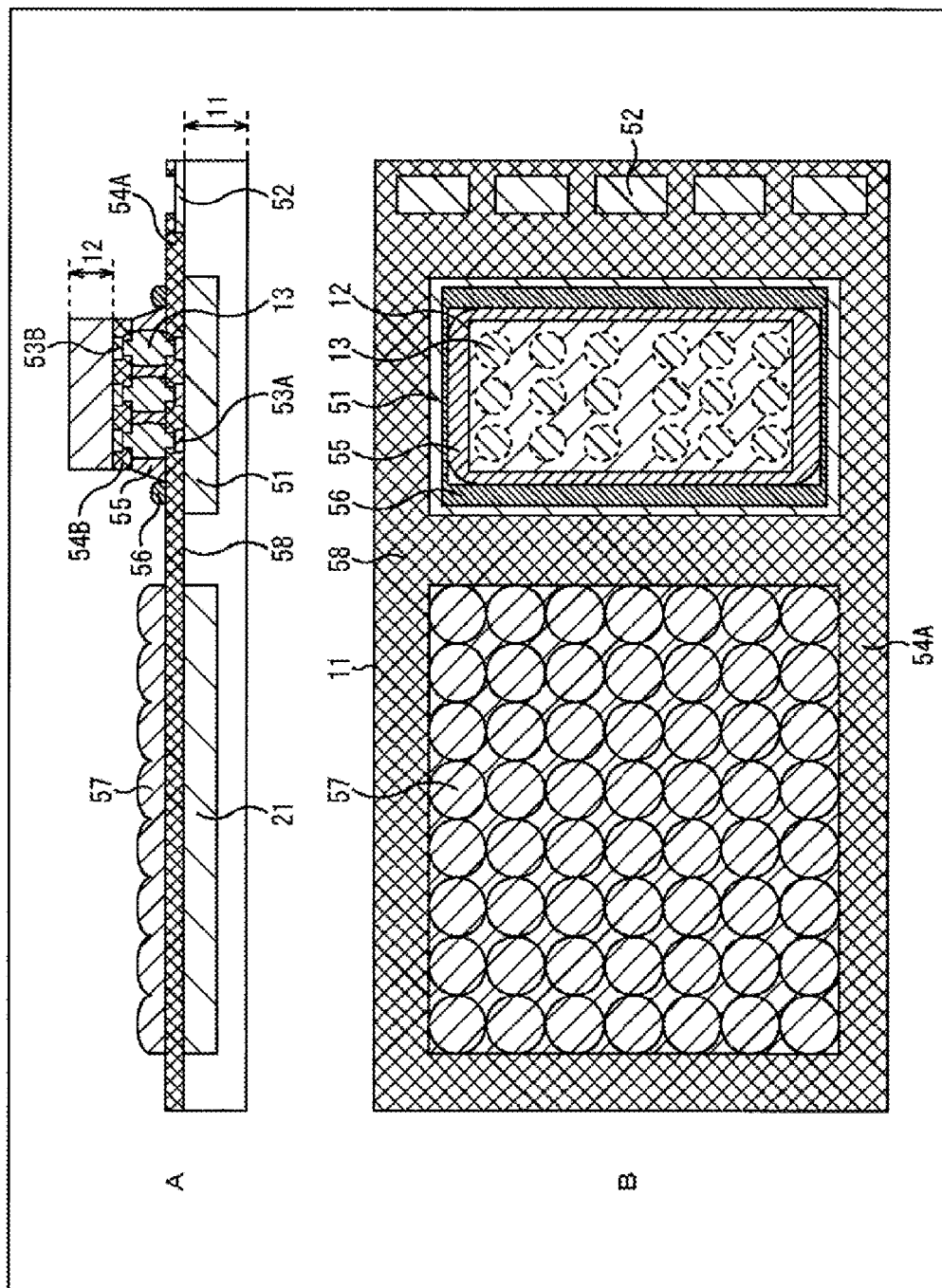
FIG. 2 is a view illustrating a first example structure of the CMOS image sensor of FIG. 1.
Figure 3:
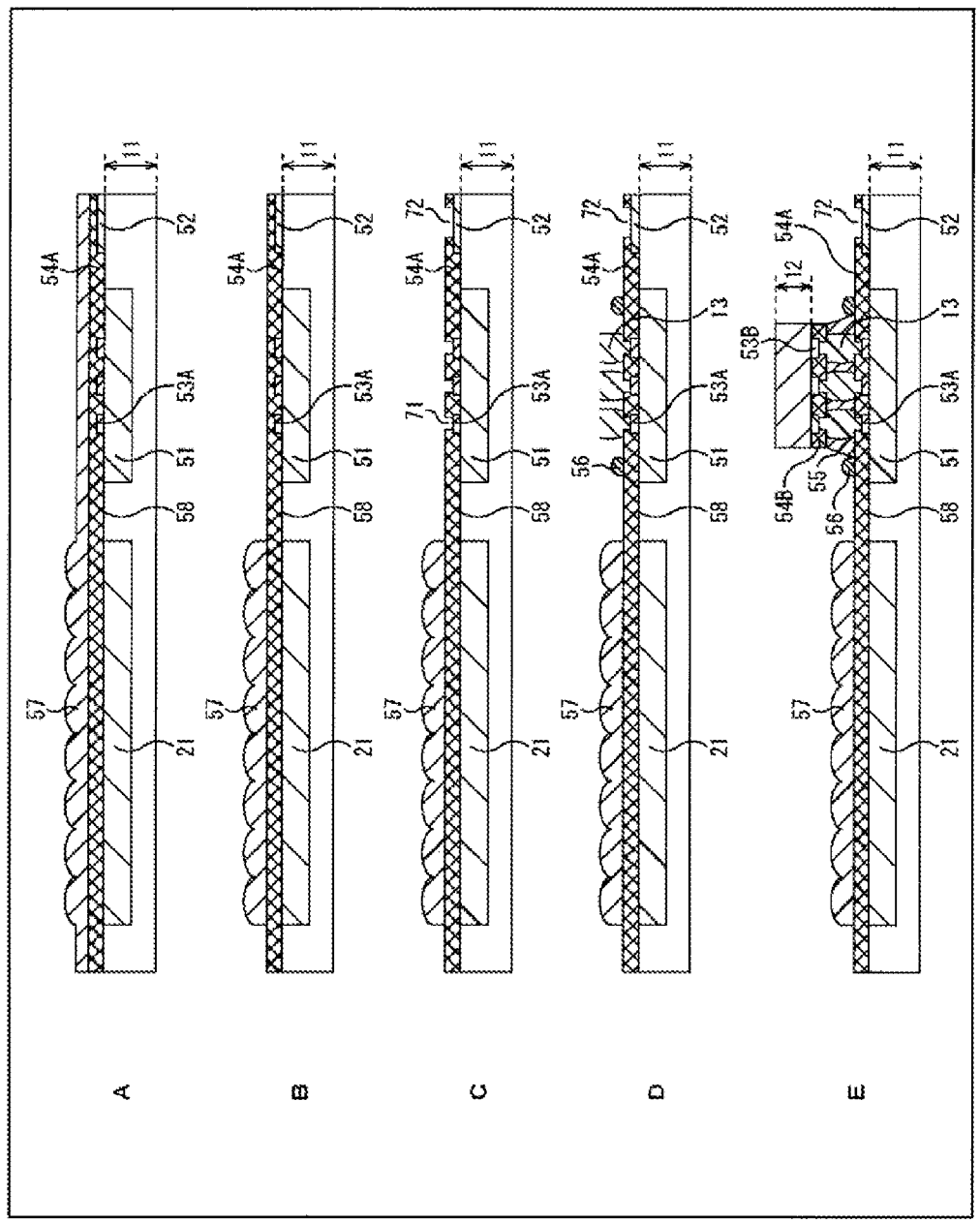
FIG. 3 is a view for describing an overview of a manufacturing method of the CMOS image sensor of FIG. 2.

FIG. 3 is a view for describing an overview of a manufacturing method of the CMOS image sensor 10 of FIG. 2.

First, as illustrated in FIG. 3A, the passivation 54A and the lens material 57 are stacked on the entire surface on the light irradiation side of the semiconductor chip 11, where the pixel region 21, the peripheral circuit unit 51, and the electrode pads 52 for wire bonding are formed.

Next, as illustrated in FIG. 3B, the region 58 other than the pixel region 21 of the lens material 57 is etched and an opening is made. Then, as illustrated in FIG. 3C, to connect the bumps 13 and the electrode pads 53A for bump connection, regions of the passivation 54A that correspond to the electrode pads 53A for bump connection are etched and opening portions 71 for bumps are formed. In addition, to connect wire bonding and the electrode pads 52 for wire bonding, regions that correspond to the electrode pads 52 for wire bonding are etched and opening portions 72 for wire bonding are formed. Then, as illustrated in FIG. 3D, the bumps 13 are formed on the electrode pads 53A for bump connection in the peripheral circuit unit 51, and the dam 56 is formed around the bonding region of the semiconductor chip 12 on the peripheral circuit unit 51.

Then, as illustrated in FIG. 3E, the semiconductor chip 12 where the electrode pads 53B for bump connection connected to the bumps 13 are formed is bonded onto the peripheral circuit unit 51 of the semiconductor chip 11 so that the bumps 13 of the semiconductor chip 11 and the semiconductor chip 12 are connected. Then, the space between the semiconductor chip 11 and the semiconductor chip 12 is filled with the under-fill resin 55.

Figure 4:
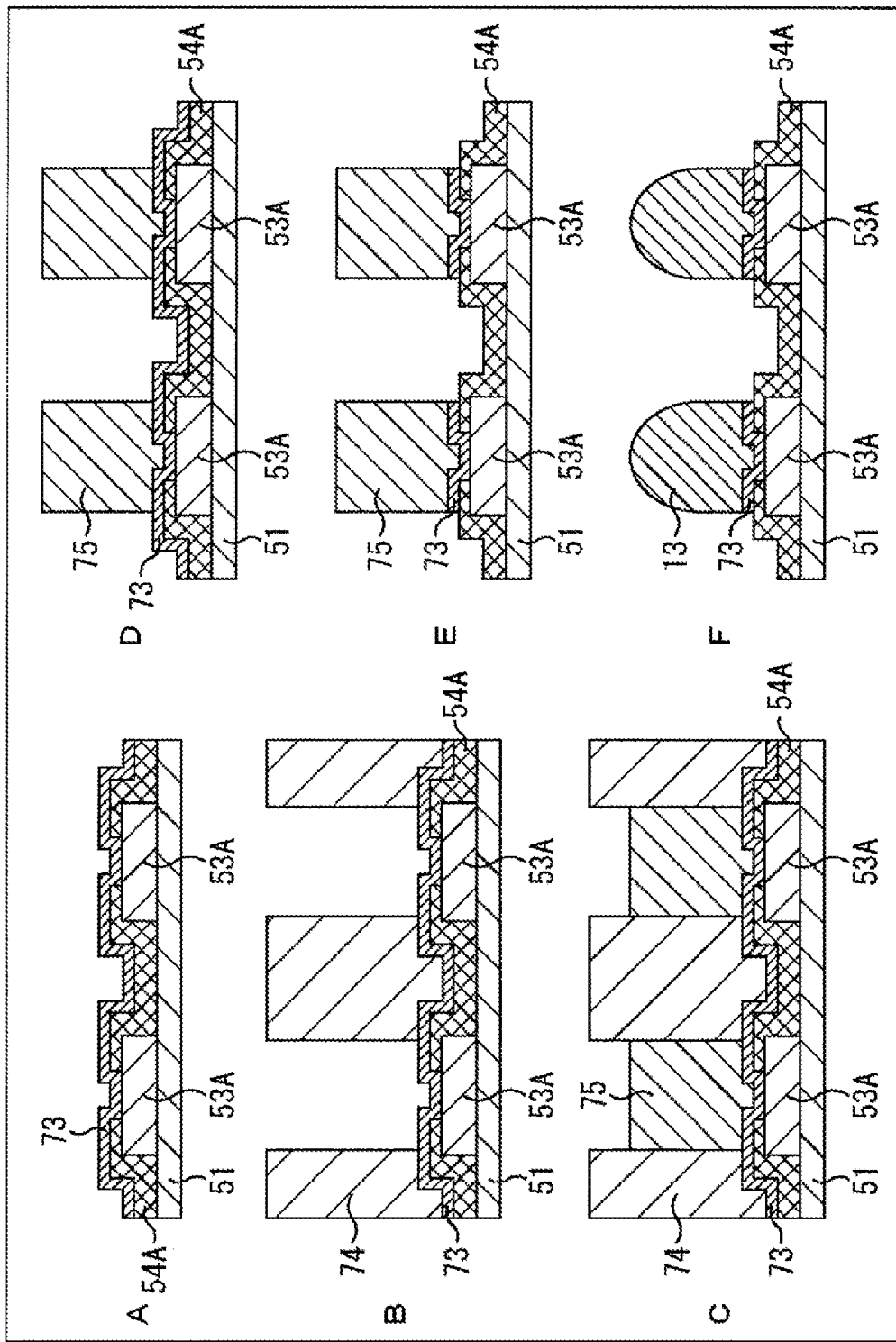
FIG. 4 is a view for describing details of a formation method of bumps.

FIG. 4 is an enlarged view of the vicinity of the peripheral circuit unit 51 for describing details of a formation method of the bumps 13 of the semiconductor chip 11.

First, as illustrated in FIG. 4A, a seed metal 73 is deposited. Then, as illustrated in FIG. 4B, photolithography is performed and a resist 74 is formed in a region other than regions where the bumps 13 are formed.

Next, as illustrated in FIG. 4C, plating growth of solder is performed by using the resist 74 as a mask; thus, solders 75 are formed. Then, as illustrated in FIG. 4D, the resist 74 is removed. Then, as illustrated in FIG. 4E, the seed metal 73 in a region other than the solders 75 is etched. Lastly, as illustrated in FIG. 4F, reflow is performed and the bumps 13 are formed.

Figure 5:
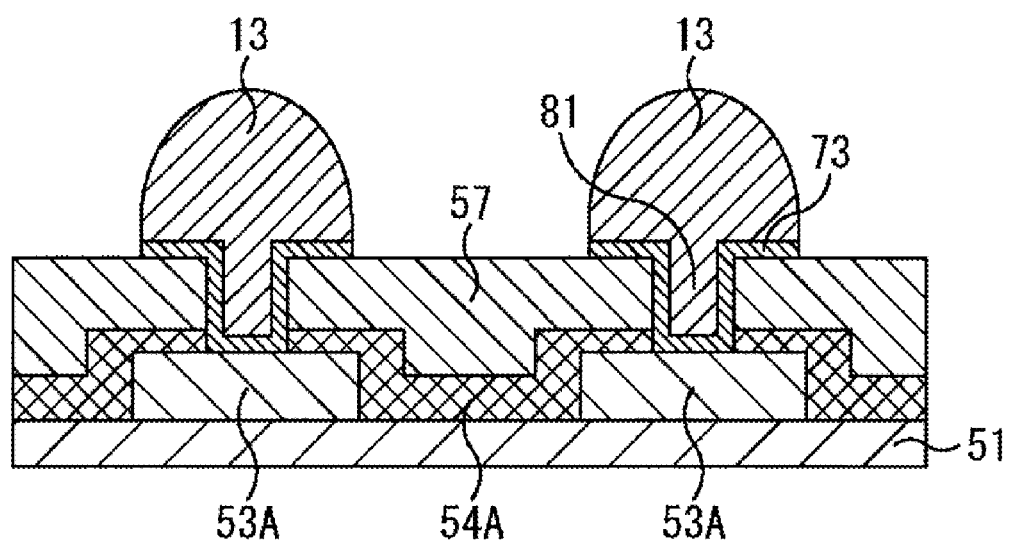
FIG. 5 is a view illustrating an example structure of bumps when a lens material is stacked on the entire surface on the light irradiation side of a semiconductor chip.

In contrast, in the case where the lens material 57 is stacked on the entire surface on the light irradiation side of the semiconductor chip 11, the lens material 57 exists in addition to the passivation 54A on the light irradiation side of the electrode pads 53A for bump connection, as illustrated in FIG. 5. Accordingly, it is necessary to make openings in the passivation 54A and the lens material 57 to form opening portions 81. Accordingly, the aspect ratio between the depth of the opening portion 81 and the open width is large.

Thus, the embeddability of the solder and the seed metal 73 at the time of forming the bumps 13 is degraded, and resist residue due to underexposure and underdevelopment at the time of lithography becomes likely to occur. As a result, malformation of the bumps 13 and the like occur.

In addition, since the lens material 57 includes an organic substance, gas occurs from the lens material 57 around the opening portions 81 of the passivation 54A and a reaction product is produced by reaction with an etching gas at the time of etching for forming the opening portions 81 of the passivation 54A. Furthermore, in the case where the lens material 57 is a material more brittle than the passivation 54A, the lens material 57 is physically etched to be scattered at the time of etching for forming the opening portions 81 of the passivation 54A, and the scattered lens material 57 inhibits the etching for forming the opening portions 81 of the passivation 54A. Thus, an abnormality of the opening portions 81 of the passivation 54A occurs, and malformation of the bumps 13, degradation of connection resistance, and the like occur.

As the bumps 13 are increasingly miniaturized and the pitch of the bumps 13 is increasingly narrowed, the aspect ratio of the opening portion 81 is further increased and the above-described problems at the time of forming the bumps 13 become significant. However, in the CMOS image sensor 10, in which the column processing unit 25-2 is formed on the semiconductor chip 12 different from the semiconductor chip 11 and flip-chip bonding is performed, an increase in the number of the bumps 13 enables high-speed operation. Accordingly, it is desirable to arrange as many bumps 13 as possible in the limited size of the semiconductor chip 12, and miniaturization of the bumps 13 and narrowing of the pitch of the bumps 13 are necessary. Also in the case where the lens material 57 is thick, the aspect ratio of the opening portion 81 is increased and the above-described problems at the time of forming the bumps 13 become significant.

Since the electrode pads 52 for wire bonding are sufficiently large, in the etching for forming the opening portions 72 for wire bonding, which are formed on the electrode pads 52 for wire bonding, the influence of the lens material 57 around the opening portions 72 for wire bonding is small. In addition, a wire ball is formed not by lithography but by mechanically forming an alloy by using ultrasound and pressure and performing crimping; therefore, problems like those at the time of forming the bumps 13 do not occur.

Meanwhile, in the CMOS image sensor 10, openings are made in at least regions where the bumps 13 and the electrode pads 52 for wire bonding are formed; therefore, as illustrated in FIG. 4E, the aspect ratio of the opening portion 71 for a bump is smaller than that of the opening portion 81 of FIG. 5. Accordingly, the embeddability of the solder and the seed metal 73 at the time of forming the bumps 13 can be improved. In addition, the flow of liquid is not obstructed at the time of wet processing, such as development. As a result, occurrence of residue of the resist 74 or the like due to underexposure and underdevelopment at the time of lithography can be prevented. Furthermore, at the time of etching for forming the opening portions 71 for bumps of the passivation 54A, etching can be prevented from being inhibited by the lens material 57 around the opening portions 71 for bumps.

(Second Example Structure of Pixel Region and Peripheral Circuit)

Figure 6:
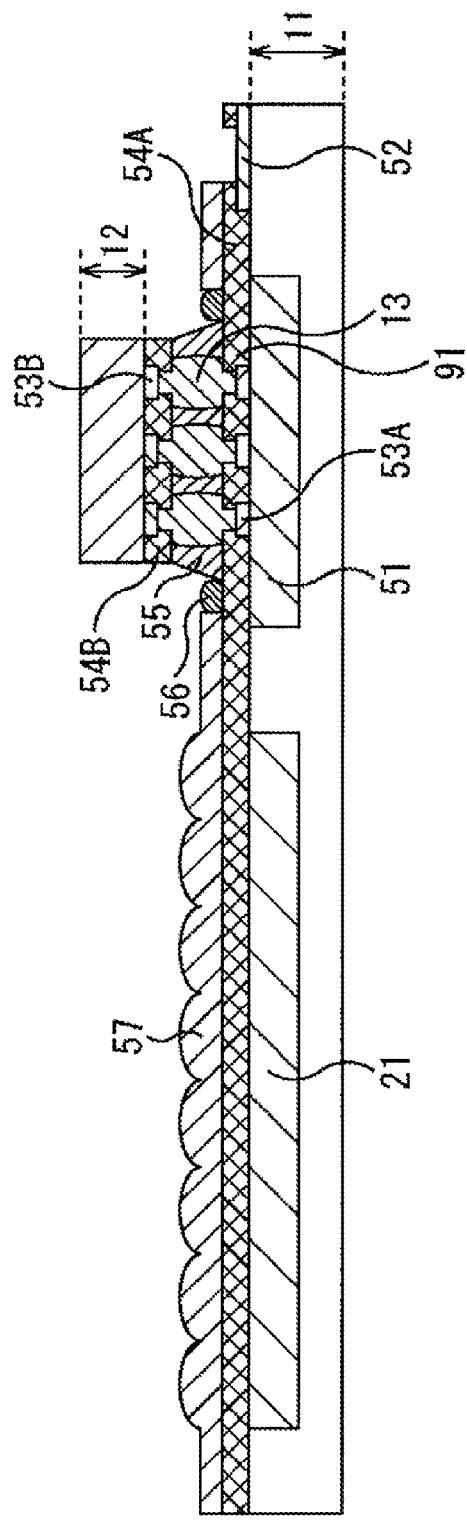
FIG. 6 is a cross-sectional view illustrating a second example structure of the CMOS image sensor of FIG. 1.

FIG. 6 is a cross-sectional view illustrating a second example structure of the CMOS image sensor 10 of FIG. 1.

The structure of the CMOS image sensor 10 of FIG. 6 is the same as the structure of FIG. 2 except that the lens material 57 is formed in a region other than a region 91, which corresponds to the semiconductor chip 12 and is the whole region inside the dam 56 (including the dam 56) on the semiconductor chip 11, and the electrode pads 52 for wire bonding.

That is, in the example of FIG. 6, the lens material 57 is formed to have openings in the region 91, which corresponds to the semiconductor chip 12 and is larger than the semiconductor chip 12, on the semiconductor chip 11 and regions of the electrode pads 52 for wire bonding.

For example, when the dam 56 is formed at a position approximately 200 μm away from the edge of the semiconductor chip 12, an opening is made in the lens material 57 around 200 μm from the edge of a region to which the semiconductor chip 12 is bonded on the semiconductor chip 11.

(Third Example Structure of Pixel Region and Peripheral Circuit)

Figure 7:
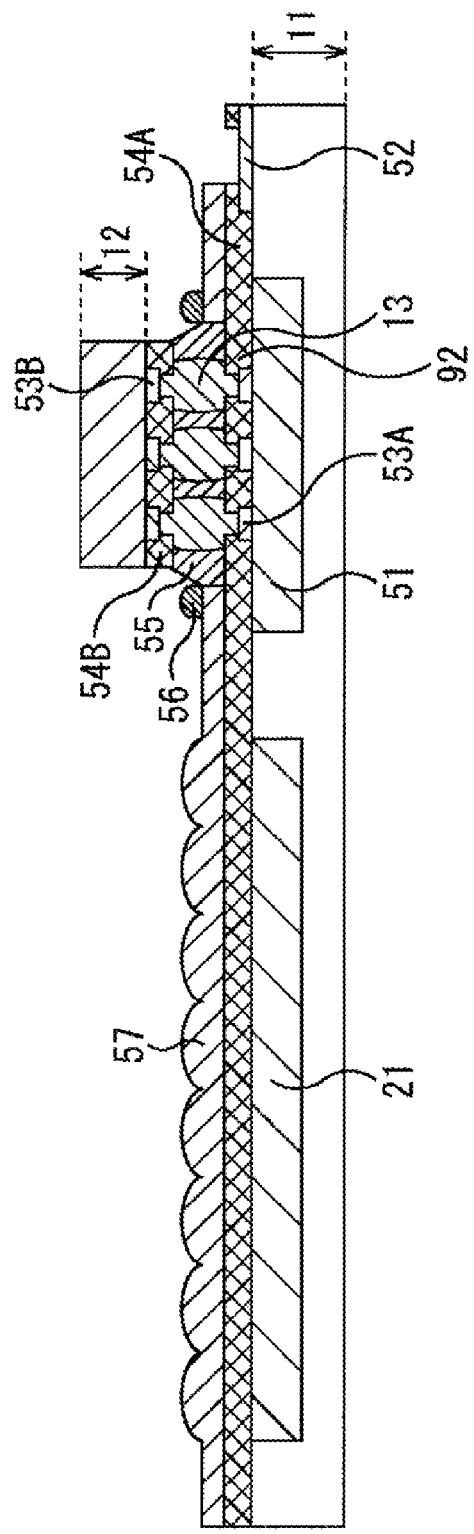
FIG. 7 is a cross-sectional view schematically illustrating a third example structure of the CMOS image sensor of FIG. 1.

FIG. 7 is a cross-sectional view schematically illustrating a third example structure of the CMOS image sensor 10 of FIG. 1.

The structure of the CMOS image sensor 10 of FIG. 7 is the same as the structure of FIG. 2 except that the lens material 57 is formed to have openings in only a region 92, which is part of the inside of the dam 56 (including the dam 56) on the semiconductor chip 11 and is larger than the size of the semiconductor chip 12, and the electrode pads 52 for wire bonding.

That is, in the example of FIG. 7, the lens material 57 is formed to have openings in the region, which corresponds to the semiconductor chip 12 and is larger than the size of the semiconductor chip 12 and smaller than a region inside the dam 56 (including the dam 56), on the semiconductor chip 11 and the electrode pads 52 for wire bonding.

As described above, in the examples of FIGS. 6 and 7, the lens material 57 is also formed in a region other than the pixel region 21; therefore, the lens material 57 can protect the region other than the pixel region 21 as well. In addition, when the lens material 57 includes a color filter that prevents reflection of light, reflection of light from the region other than the pixel region 21 can be prevented.

Although the lens material 57 is not formed in part of a region on the peripheral circuit unit 51, the part can be protected as well because it is filled with the under-fill resin 55. In addition, by selecting an appropriate resin as the under-fill resin 55, reflection of light from the inside of the dam 56 (not including the dam 56) can be prevented.

(Fourth Example Structure of Pixel Region and Peripheral Circuit)

Figure 8:
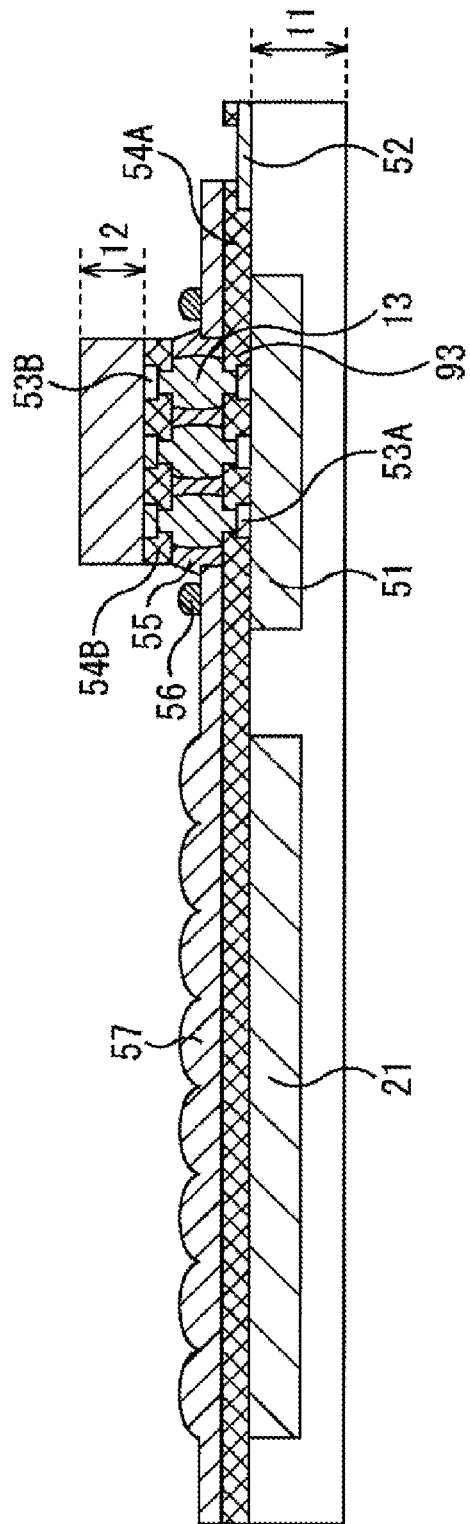
FIG. 8 is a cross-sectional view schematically illustrating a fourth example structure of the CMOS image sensor of FIG. 1.

FIG. 8 is a cross-sectional view schematically illustrating a fourth example structure of the CMOS image sensor 10 of FIG. 1.

The structure of the CMOS image sensor 10 of FIG. 8 is the same as the structure of FIG. 2 except that the lens material 57 is formed to have openings in only a region 93, which has the same size as the semiconductor chip 12, inside the dam 56 on the semiconductor chip 11 and the electrode pads 52 for wire bonding.

That is, in the example of FIG. 8, the lens material 57 is formed to have openings in the region 93, which corresponds to the semiconductor chip 12 and has the same size as the semiconductor chip 12, on the semiconductor chip 11 and the electrode pads 52 for wire bonding.

In consideration of misalignment of the semiconductor chip 12, the lens material 57 may have an opening in a region that is at the inner side than the region 93 by the amount of misalignment and is smaller than the size of the semiconductor chip 12. Note that when an opening region of the lens material 57 is too small, problems occur at the time of forming the bumps 13 as in the case where the lens material 57 is formed on the entire surface of the semiconductor chip 11.

Figure 9:
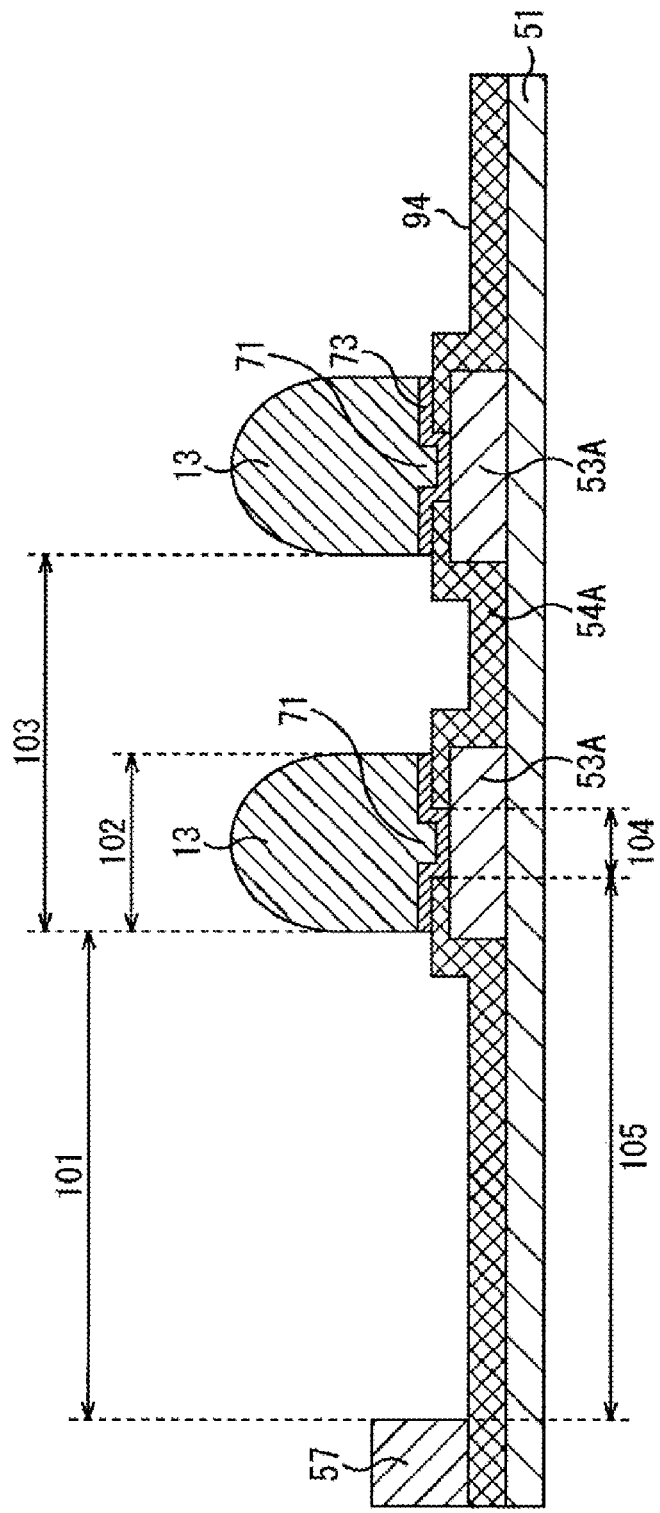
FIG. 9 is a view for describing an example of an opening region.

Accordingly, for example, as illustrated in FIG. 9, an opening region 94 other than the electrode pads 52 for wire bonding of the lens material 57 is formed such that a distance 101 from the side of the bump 13 closest to the lens material 57 to the side of the lens material 57 closest to the bump 13 is larger than the larger one of twice the opening size at the time of lithography, that is, a diameter 102 of the bump 13, and a minimum value 103 of the pitch of the bumps 13.

Figure 10:
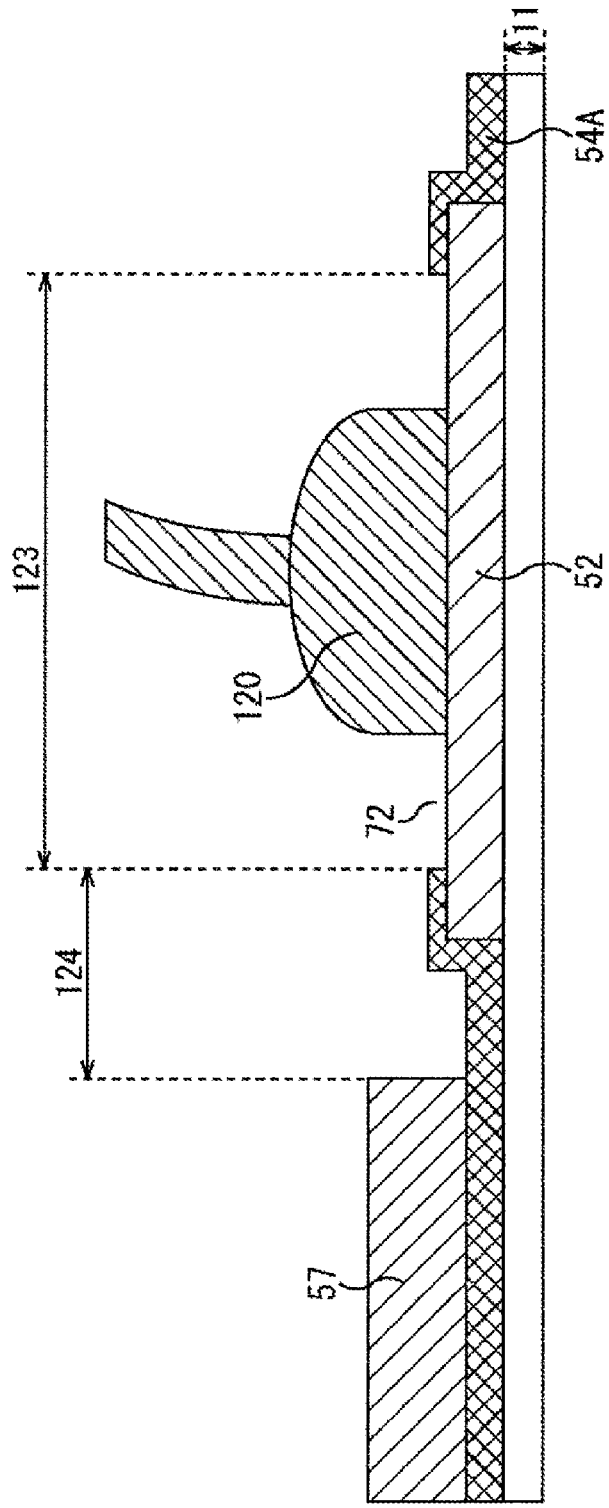
FIG. 10 is a view for describing another example of an opening region.

Alternatively, as illustrated in FIGS. 9 and 10, the opening region 94 is formed such that the ratio (hereinafter called wire bonding ratio) of a distance 124 from the side of the opening portion 72 for wire bonding closest to the lens material 57 to the side of the lens material 57 closest to the opening portion 72 for wire bonding to a size 123 of the opening portion 72 for wire bonding in a direction in which the lens material 57 and a wire bonding 120 are aligned is smaller than the ratio (hereinafter called bump ratio) of a distance 105 from the side of the opening portion 71 for a bump closest to the lens material 57 to the side of the lens material 57 closest to the opening portion 71 for a bump to a size 104 of the opening portion 71 for a bump in a direction in which the lens material 57 and the bumps 13 are aligned.

That is, the opening region 94 is formed such that the bump ratio is equal to or greater than the wire bonding ratio that does not cause a problem at the time of forming the wire bonding 120.

As described above, in the examples of FIGS. 8 to 10, as in the case of FIGS. 6 and 7, the lens material 57 is also formed in a region other than the pixel region 21. Accordingly, the region other than the pixel region 21 can be protected as well and reflection of light from the region other than the pixel region 21 can be prevented.

The size of an opening region (the region 93 or the opening region 94) other than the electrode pads 52 for wire bonding of the lens material 57 is equal to or smaller than the size of the semiconductor chip 12. Accordingly, the semiconductor chip 12 and the under-fill resin 55 can protect the opening region of the lens material 57 on the peripheral circuit unit 51 and prevent reflection of light from the opening region.

(Examples of Shape of Region 92)

Figure 11:
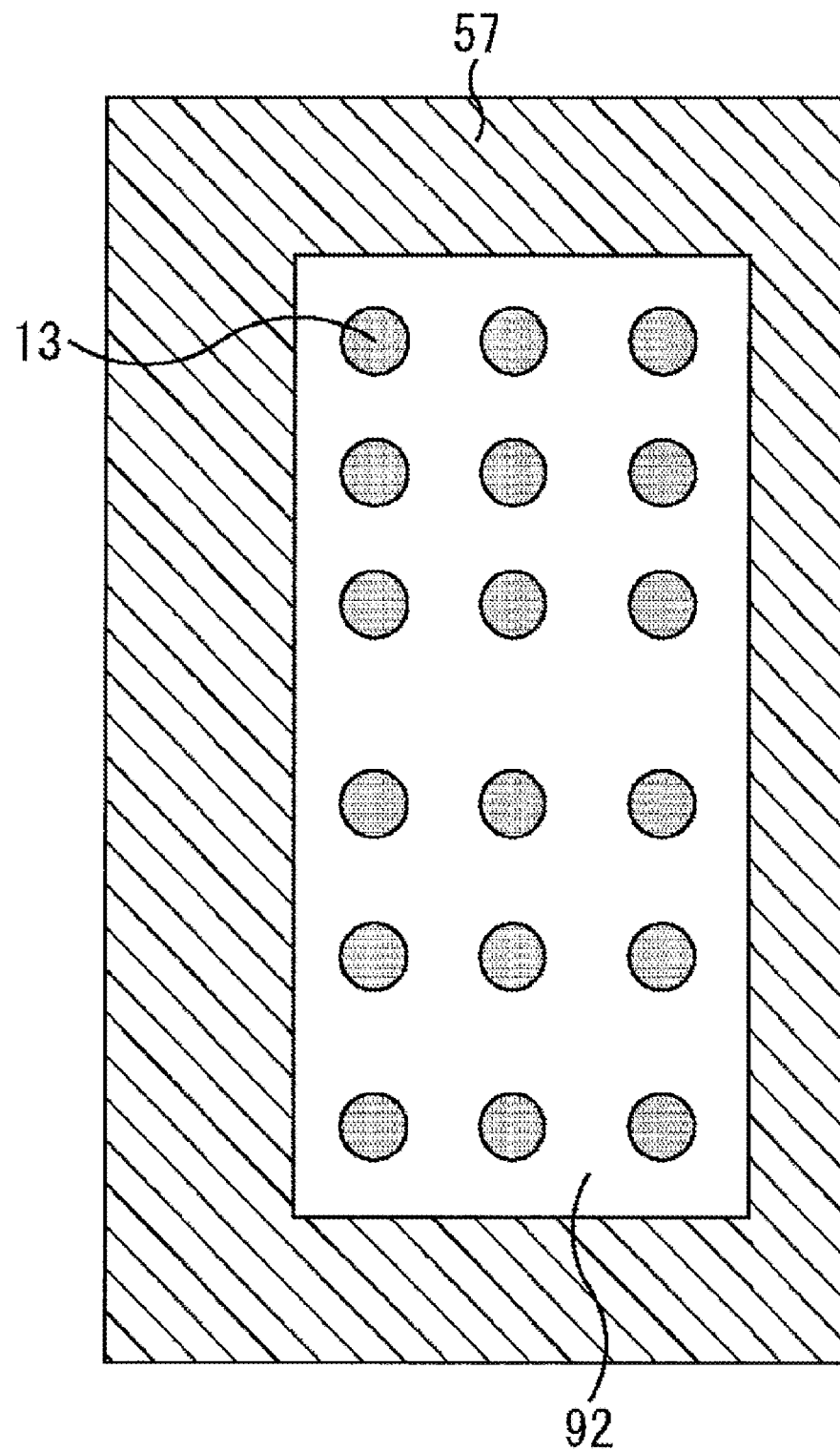
FIG. 11 is a view illustrating an example of the shape of the region of FIG. 7.
Figure 12:
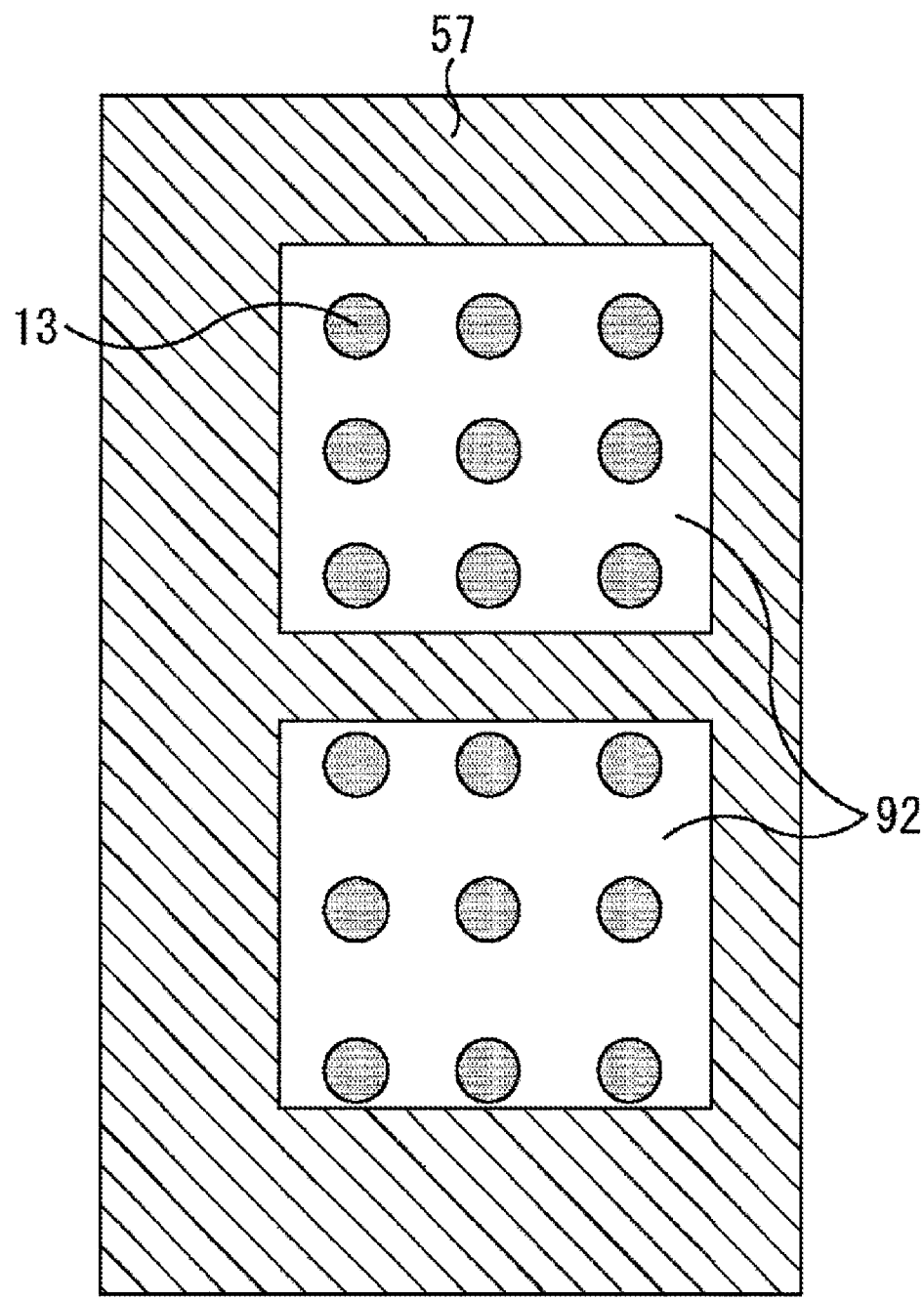
FIG. 12 is a view illustrating another example of the shape of the region of FIG. 7.
Figure 13:
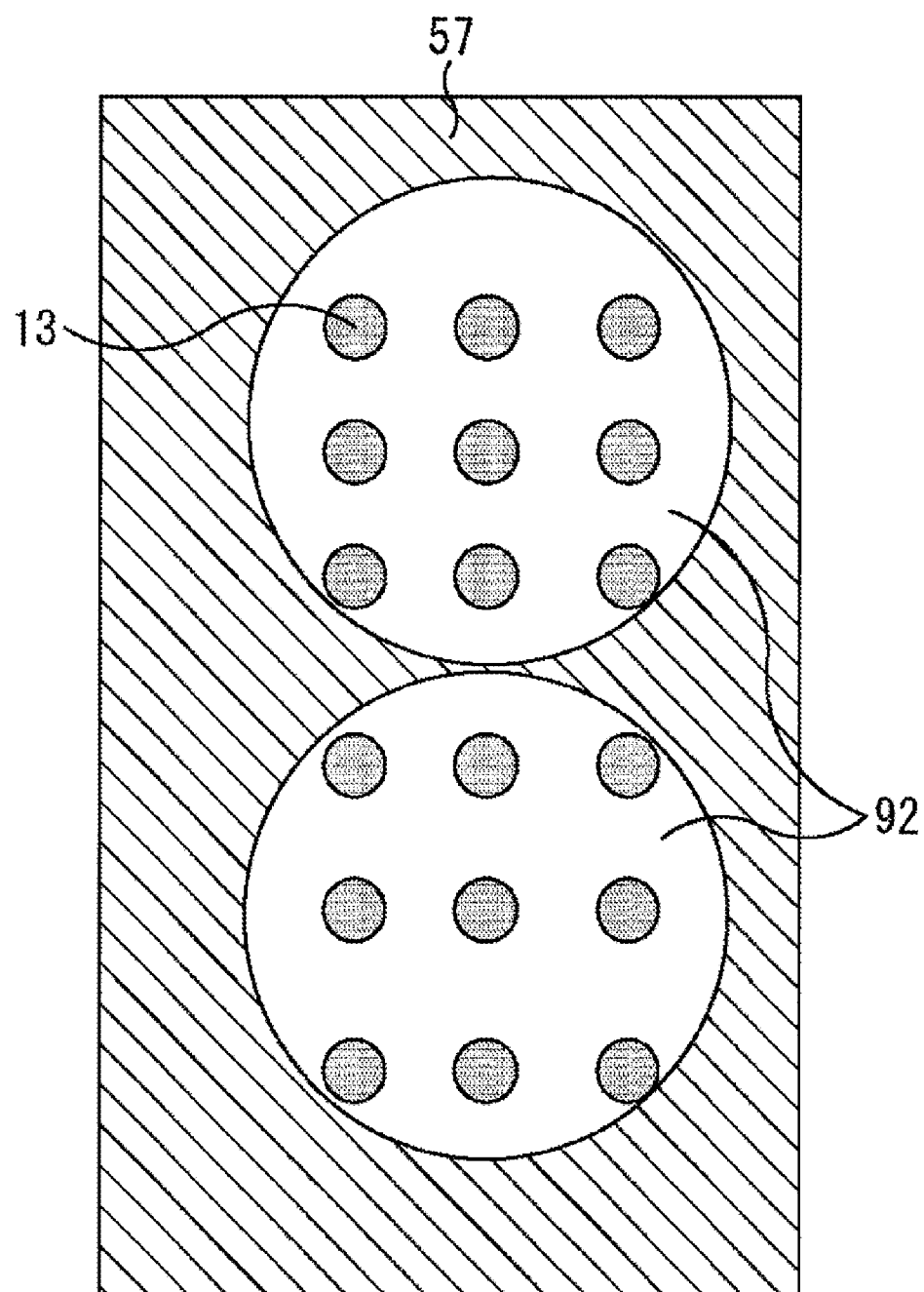
FIG. 13 is a view illustrating still another example of the shape of the region of FIG. 7.

FIGS. 11 to 13 are views of part of the semiconductor chip 11, seen from the light irradiation side, which show examples of the shape of the region 92 of FIG. 7.

As illustrated in FIG. 11, the region 92 includes, for example, one region that surrounds all the bumps 13 formed on the semiconductor chip 11. In this case, level differences formed by the lens material 57 on the surface on the light irradiation side of the semiconductor chip 11 are reduced, and the flow of liquid is less likely to be obstructed at the time of wet processing, such as development.

Note that, as illustrated in FIG. 12, the region 92 may include two or more regions that divide the bumps 13 into two or more groups and surround the bumps 13 for each group. In addition, the shape of the region 92 is not limited to a rectangular shape, and may be a circular shape as illustrated in FIG. 13, for example.

Although the region 92 is described using FIGS. 11 to 13, the same applies to the region 93 and the opening region 94.

In the first embodiment, the case where an embodiment of the present disclosure is applied to a CMOS image sensor is described; however, an embodiment of the present disclosure can also be applied to a solid-state imaging device other than a CMOS image sensor, such as a charge coupled device (CCD) image sensor. In addition, an embodiment of the present disclosure can be applied to an element in which a resin such as polyimide is used as a protective film instead of the lens material 57 and bumps are formed. Furthermore, the method for distributing components of the CMOS image sensor 10 to the semiconductor chip 11 and the semiconductor chip 12 is not limited to the above-described method. In addition, units connected by bumps are not limited to the column processing units 25-1 and 25-2, the horizontal driving unit 26, and the system control unit 27. Furthermore, the semiconductor chip 12 may be formed by a plurality of semiconductor chips. Units formed on the plurality of semiconductor chips may be the same or different.

Second Embodiment (Overview of Example Configuration of Second Embodiment of CMOS Image Sensor)

Figure 14:
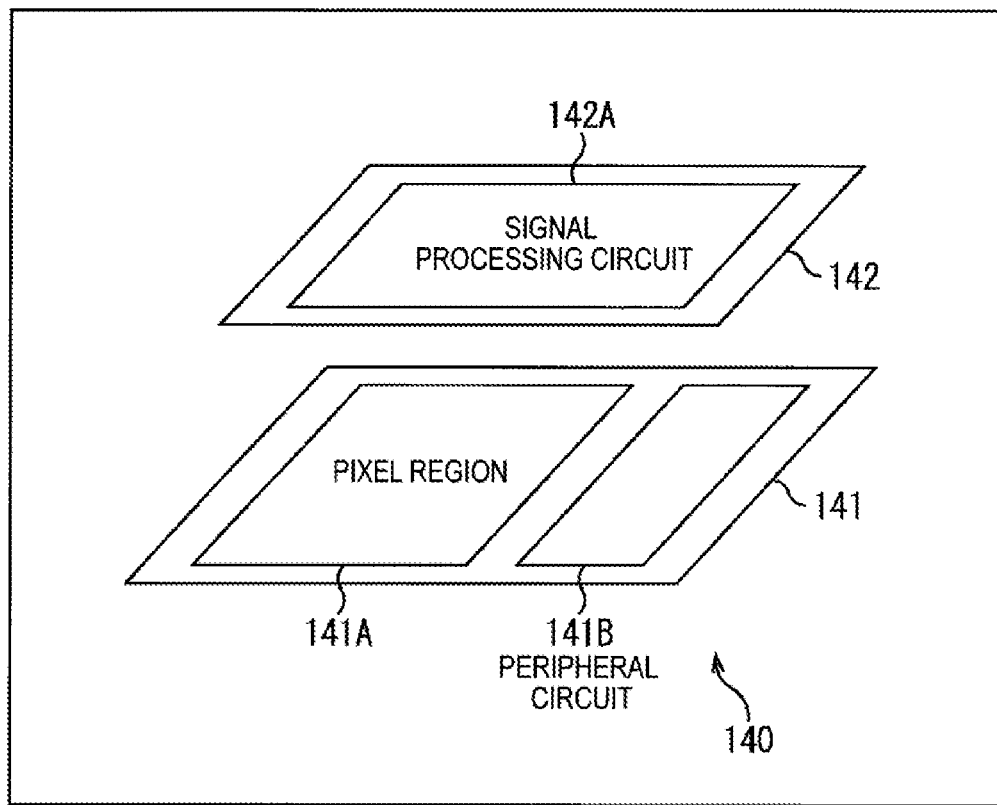
FIG. 14 is a view illustrating an overview of an example configuration of a second embodiment of a CMOS image sensor to which the present disclosure is applied.

FIG. 14 is a view illustrating an overview of an example configuration of a second embodiment of a CMOS image sensor to which the present disclosure is applied.

In a CMOS image sensor 140 of FIG. 14, a lower chip 141, which is a semiconductor chip on the lower side of the figure, and an upper chip 142, which is a semiconductor chip on the upper side of the figure, are flip-chip bonded to each other.

The lower chip 141 includes a semiconductor substrate and a metal wiring layer of Cu, Al, or the like, and a pixel region 141A and a peripheral circuit 141B are formed on the lower chip 141. The configuration of the pixel region 141A is similar to the configuration of the pixel region 21 of FIG. 1. The peripheral circuit 141B, whose configuration is similar to the configuration of the vertical driving unit 24, the column processing units 25-1 and 25-2, the horizontal driving unit 26, and the system control unit 27, is formed on the same lower chip 141 where the pixel region 141A is formed, and includes bumps, which are not shown, for bonding to the upper chip 142.

A lens material, which is not shown, formed on the lower chip 141 is formed to have an opening in a region corresponding to a bonding region of the upper chip 142. Accordingly, as in the first embodiment, occurrence of problems at the time of forming the bumps, which are not shown, included in the peripheral circuit 141B can be prevented.

The upper chip 142 includes a semiconductor substrate and a metal wiring layer of Cu, Al, or the like, and a signal processing circuit 142A is formed on the upper chip 142. The configuration of the signal processing circuit 142A is similar to the configuration of the memory and signal processing unit 28 of FIG. 1.

(Example Configuration of CMOS Image Sensors Before Dicing)

Figure 15:
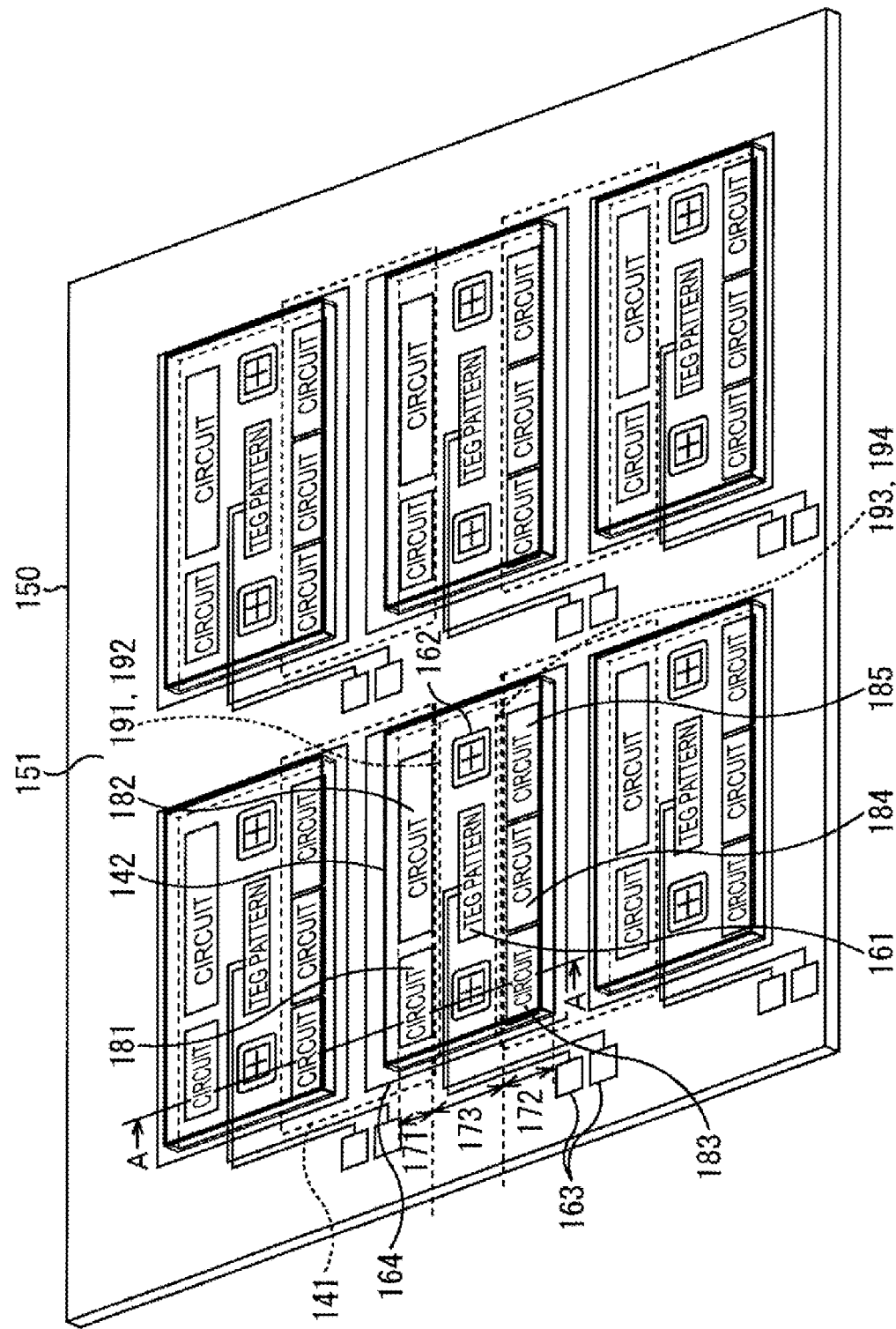
FIG. 15 is a perspective view illustrating an example configuration of the CMOS image sensors of FIG. 14 before dicing.
Figure 16:
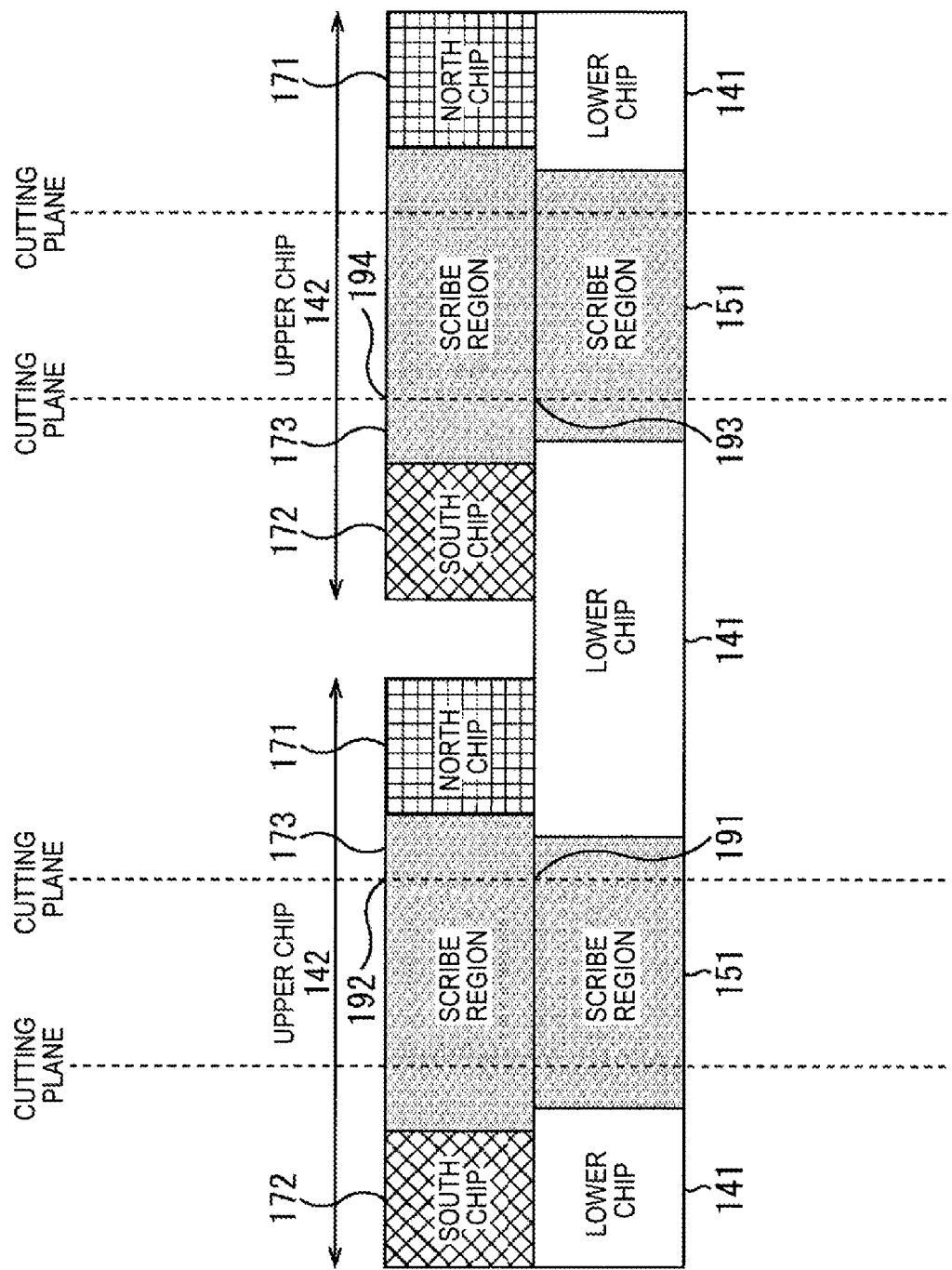
FIG. 16 is a cross-sectional view along A-A of FIG. 15.

FIG. 15 is a perspective view illustrating an example configuration of the CMOS image sensors 140 of FIG. 14 before dicing, and FIG. 16 is a cross-sectional view along A-A of FIG. 15.

As illustrated in FIG. 15, the CMOS image sensors 140 before dicing include a semiconductor wafer 150 where the lower chips 141 are arranged in an array and the upper chips 142 bonded across two lower chips 141. Note that FIG. 15 shows only a part of the semiconductor wafer 150 where 2 (lateral)×3 (longitudinal) lower chips 141 are formed.

An external shape of each of the lower chip 141 (first semiconductor chip) and the upper chip 142 is a rectangular shape having a predetermined thickness. A scribe region 151 is provided between the lower chips 141. A test element group (TEG) pattern 161 and marks 162 are formed in the scribe region 151 between two lower chips 141 across which the upper chip 142 is present.

The TEG pattern 161 is a pattern for evaluating bumps, which are not shown, that bond the lower chips 141 and the upper chips 142 to each other. The marks 162 are marks used for alignment at the time of bonding the lower chips 141 and the upper chips 142. The lower chips 141 and the upper chips 142 are bonded to each other such that the marks 162 coincide with marks, which are not shown, formed on the upper chip 142.

In addition, electrodes 163 for evaluating the bumps, which are not shown, that bond the lower chips 141 and the upper chips 142 are formed in the scribe region 151 to be connected to the TEG pattern 161. Around a region to which the upper chip 142 is bonded on the lower chips 141, a dam 164 that prevents leakage of an under-fill resin filling a space between the lower chips 141 and the upper chip at the time of bonding the lower chips 141 and the upper chip to each other is formed.

The upper chip 142 is formed by a north chip 171 formed on the upper side (north side) of the figure and a south chip 172 formed on the lower side (south side) of the figure between which a scribe region 173 is sandwiched. An external shape of each of the north chip 171 (second semiconductor chip) and the south chip 172 (third semiconductor chip) is a rectangular shape having a predetermined thickness. Marks, which are not shown, used for alignment at the time of bonding the lower chips 141 and the upper chips 142 to each other are formed in the scribe region 173.

On the upper chip 142, the signal processing circuit 142A is divided into five circuits 181 to 185 and, among the circuits, two circuits 181 and 182 are formed on the north chip 171 and three circuits 183 to 185 are formed on the south chip 172.

The CMOS image sensors 140 before dicing are separated by dicing (cutting) the scribe region 151 around the lower chips 141, as illustrated in FIG. 16.

Thus, in the CMOS image sensor 140 after the separation, the whole region of a side (first side) 191 in the left-right direction (horizontal direction) of FIG. 15 out of scribe lines forming an outline of the lower chip 141 to which the scribe region 151 is added and the whole region of a side (second side) 192 in the left-right direction of FIG. 15 out of scribe lines forming an outline of the north chip 171 to which the scribe region 173 is added are flush with each other.

In addition, the whole region of a side (third side) 193 facing the side 191 out of the scribe lines forming the outline of the lower chip 141 to which the scribe region 151 is added and the whole region of a side (fourth side) 194 in the left-right direction of FIG. 15 out of scribe lines forming an outline of the south chip 172 to which the scribe region 173 is added are flush with each other.

Note that although the whole regions of the side 191 and the side 192 are flush with each other and the whole regions of the side 193 and the side 194 are flush with each other in the second embodiment, it is not necessary that the whole regions be flush as long as at least partial regions are flush with each other.

As described above, in the CMOS image sensor 140, both the north chip 171 and the south chip 172 are formed on one upper chip 142. Accordingly, the north chip 171 and the south chip 172 can be bonded to the lower chip 141 at the same time. In addition, the lower chips 141 may be formed on the semiconductor wafer 150 in the same orientation and the lower chips 141 do not need an axis of symmetry. Furthermore, the north chip 171 and the south chip 172 do not need an axis of symmetry.

In addition, the TEG pattern 161, the marks 162, and the electrodes 163, which are used only at the time of manufacture, are arranged in the scribe region 151 and eliminated at the time of separating the CMOS image sensors 140. Accordingly, an effective region of the lower chip 141 can be increased as compared with a case where the TEG pattern 161, the marks 162, and the electrodes 163 are arranged in the CMOS image sensor 140.

Figure 17:
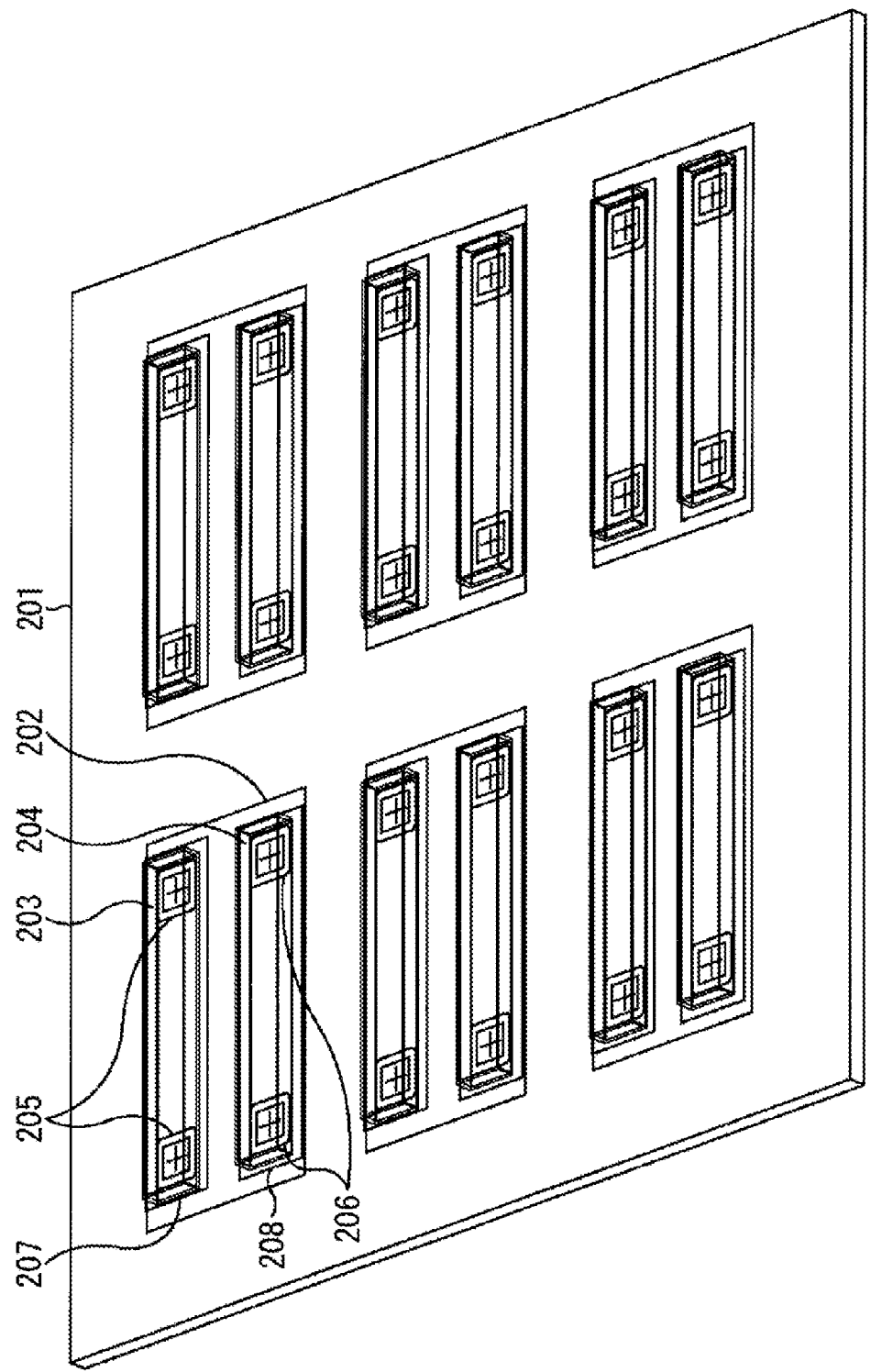
FIG. 17 is a view illustrating an example structure of a CMOS image sensor in which a north chip and a south chip are individually formed.

In contrast, in the case where a north chip 203 and a south chip 204 are individually formed on a lower chip 202 formed on a semiconductor wafer 201 as illustrated in FIG. 17, the north chip 203 and the south chip 204 are bonded to the lower chip 202 one by one.

Accordingly, it is necessary to form marks 205 and marks 206 used for alignment at the time of bonding for the north chip 203 and the south chip 204. Thus, when the marks 205 and the marks 206 are formed on the lower chip 202 on the semiconductor wafer 201 as illustrated in FIG. 17, the size of the lower chip 202 is increased and manufacturing cost is increased.

In addition, it is necessary to form dams 207 and 208 that prevent leakage of an under-fill resin filling a space between the lower chip 202 and each of the north chip 203 and the south chip 204 around bonding regions on the lower chip 202 for the north chip 203 and the south chip 204.

(Description of Manufacturing Method of CMOS Image Sensor)

Figure 18:
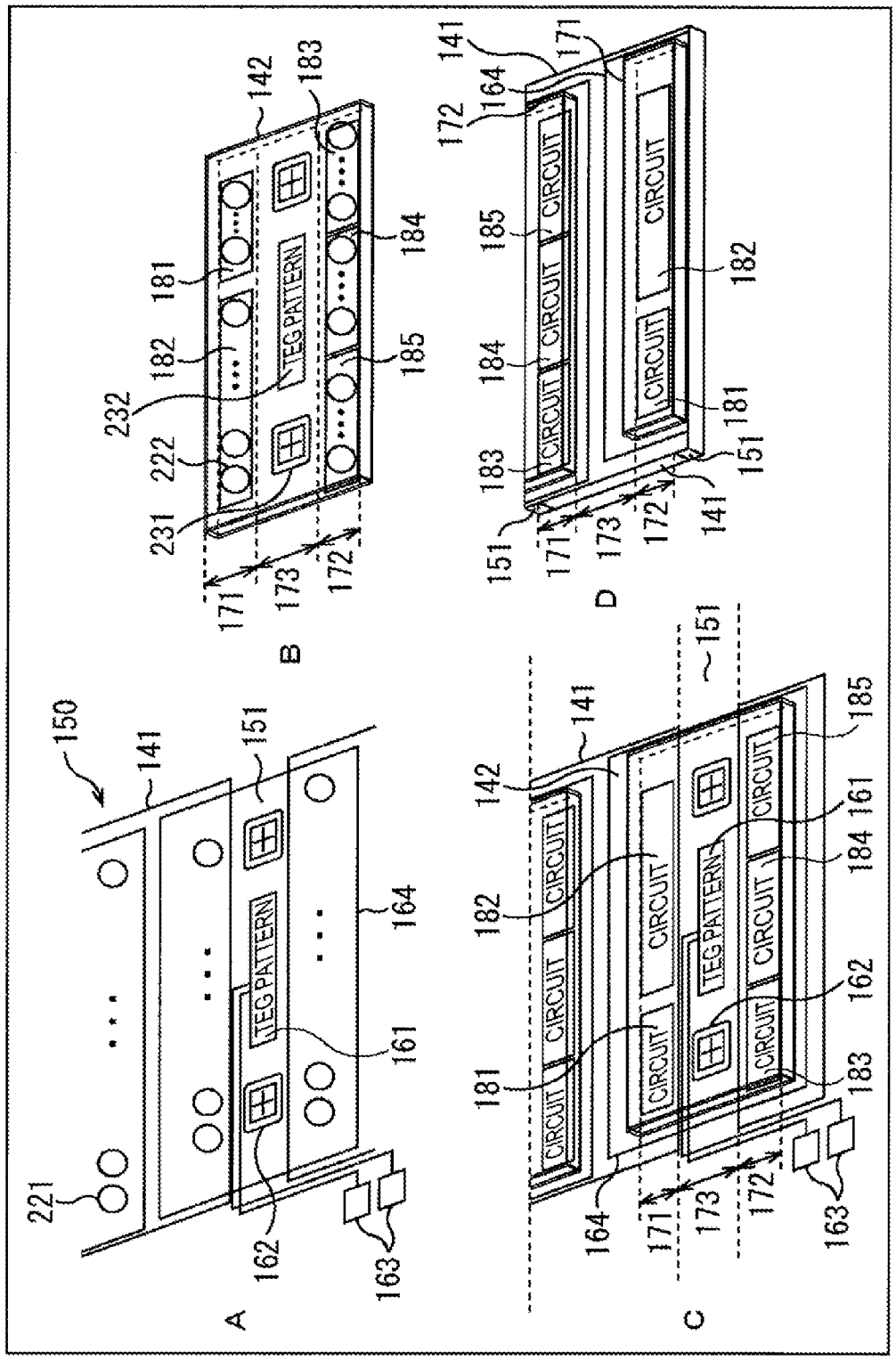
FIG. 18 is a perspective view for describing a manufacturing method of the CMOS image sensor of FIG. 14.

FIG. 18 is a perspective view for describing a manufacturing method of the CMOS image sensor 140.

First, as illustrated in FIG. 18A, the lower chip 141 is formed on the semiconductor wafer 150. The TEG pattern 161 and the marks 162 are formed in the scribe region 151 between the lower chips 141, and the electrodes 163 are formed in the scribe region 151 in a region other than between the lower chips 141. The dam 164 is formed around a region to which the upper chip 142 is bonded on the lower chips 141.

In the peripheral circuit 141B inside the dam 164 on the lower chip 141, bumps 221, such as balls or pillars, are formed by a method such as electrolytic plating, electroless plating, transfer, or crimping to be connected to electrodes for bumps, which are not shown, formed in the lower chip 141. The bumps 221 are arranged with a narrow pitch of, for example, several tens of microns. To ensure electrical characteristics and reliability thereof, the bumps 221 include a barrier layer, a seed layer, a metal layer for bonding, and the like using metal materials such as Ni, Pd, Au, Sn, Ag, Pb, Bi, Cu, and In, typically.

Next, as illustrated in FIG. 18B, the north chip 171 where the circuits 181 and 182 are formed and the south chip 172 where the circuits 183 to 185 are formed are arranged with the scribe region 173 sandwiched therebetween; thus, the upper chip 142 is formed. Bumps 222 are formed on the north chip 171 and the south chip 172. Marks 231 and a TEG pattern 232 are formed in the scribe region 173.

Then, as illustrated in FIG. 18C, the upper chips 142 are sequentially arranged on the semiconductor wafer 150 to be bonded such that the marks 162 coincide with the marks 231. Thus, the bumps 222 on the north chip 171 are bonded to the bumps 221 on the south side of one lower chip 141, and the bumps 222 on the south chip 172 are bonded to the bumps 221 on the north side of another lower chip 141 different from the lower chip 141.

In this manner, the lower chips 141 and the upper chips 142 are bonded to each other on the basis of the marks 162 and the marks 231; thus, even in the case where the bumps 221 and the bumps 222 are arranged with high density, the bumps 221 and the bumps 222 can be connected accurately.

Note that on the north side of the lower chip 141 where the north chip 171 is arranged on the south side, the south chip 172 of the upper chip 142 that is different from the upper chip 142 having the north chip 171 is arranged. In addition, on the south side of the lower chip 141 where the south chip 172 is arranged on the north side, the north chip 171 of the upper chip 142 that is different from the upper chip 142 having the south chip 172 is arranged.

Next, between the lower chips 141 and the upper chips 142, an under-fill resin is injected from one direction or two directions of south and north. In the case where the under-fill resin is injected from two directions of south and north, the under-fill resin is injected by line application from opposite directions of left and right between the south direction and the north direction. Thus, the lower chips 141 and the upper chips 142 are fixed.

Lastly, the scribe region 151 around the lower chips 141 is diced and the CMOS image sensors 140 are separated, as illustrated in FIG. 18D.

As described above, the north chip 171 and the south chip 172 are collectively bonded to the lower chips 141; therefore, the number of times of bonding can be drastically reduced as compared with a case where the north chip 203 and the south chip 204 are individually bonded to the lower chip 202 as illustrated in FIG. 17. That is, the north chip 171 and the south chip 172 can be bonded to the lower chips 141 easily.

As a result, bonding turn-around time (TAT) is shortened and manufacturing cost can be reduced. In addition, time for heat treatment necessary for bump connection is shortened and thus heat load on the semiconductor wafer 150 is reduced and the influence of heat treatment to characteristics of the CMOS image sensor 140 can be minimized.

In addition, since the north chip 171 and the south chip 172 are collectively bonded to the lower chips 141, the marks used for alignment at the time of bonding the north chip 171 and the south chip 172 and the TEG pattern for evaluating bumps can be shared.

Furthermore, the CMOS image sensor 140 does not have layout constraints, such as mirror inversion and an axis of symmetry; therefore, there is no need to change the physical arrangement in the CMOS image sensor 140.

Although the number of the lower chips 141 bonded to one upper chip 142 is two in the second embodiment, the number may be more than two. For example, the upper chip 142 may be bonded across 2 (lateral)×2 (longitudinal) lower chips, i.e., four lower chips, or may be bonded across 3 (lateral)×2 (longitudinal) lower chips, i.e., six lower chips. Note that the number of the lower chips 141 bonded to one upper chip 142 is in a trade-off relationship with yield.

Although the number of circuits forming the signal processing circuit 142A is five in the second embodiment, the number may be any number as long as it is more than one.

Furthermore, although a lens material is not formed in a region on the lower chips 141 that corresponds to a bonding region of the upper chip 142 as in the first embodiment in the second embodiment, the lens material may be formed in that region.

Although the pixel region 141A and the peripheral circuit 141B are formed on the same lower chip 141 in the second embodiment, they may be formed on different semiconductor chips. Also in this case, bonding between semiconductor chips is performed in a manner similar to that of the lower chips 141 and the upper chips 142.

Furthermore, the CMOS image sensor 10 and the CMOS image sensor 140 may be back-side illumination CMOS image sensors or front-side illumination CMOS image sensors. Note that in the case where the CMOS image sensor 10 and the CMOS image sensor 140 are front-side illumination CMOS image sensors, electrode pads for bump connection may be formed above a metal wiring layer. Accordingly, the electrode pads for bump connection can be formed in steps similar to those for forming normal electrode pads for wire bonding connection. In addition, there is no need to perform a back side re-wiring step of bringing wiring of a metal wiring layer on the back side to the front side, unlike in the case of back-side illumination CMOS image sensors. Therefore, manufacturing cost can be reduced.

Third Embodiment (Example Configuration of Embodiment of Imaging Device)

Figure 19:
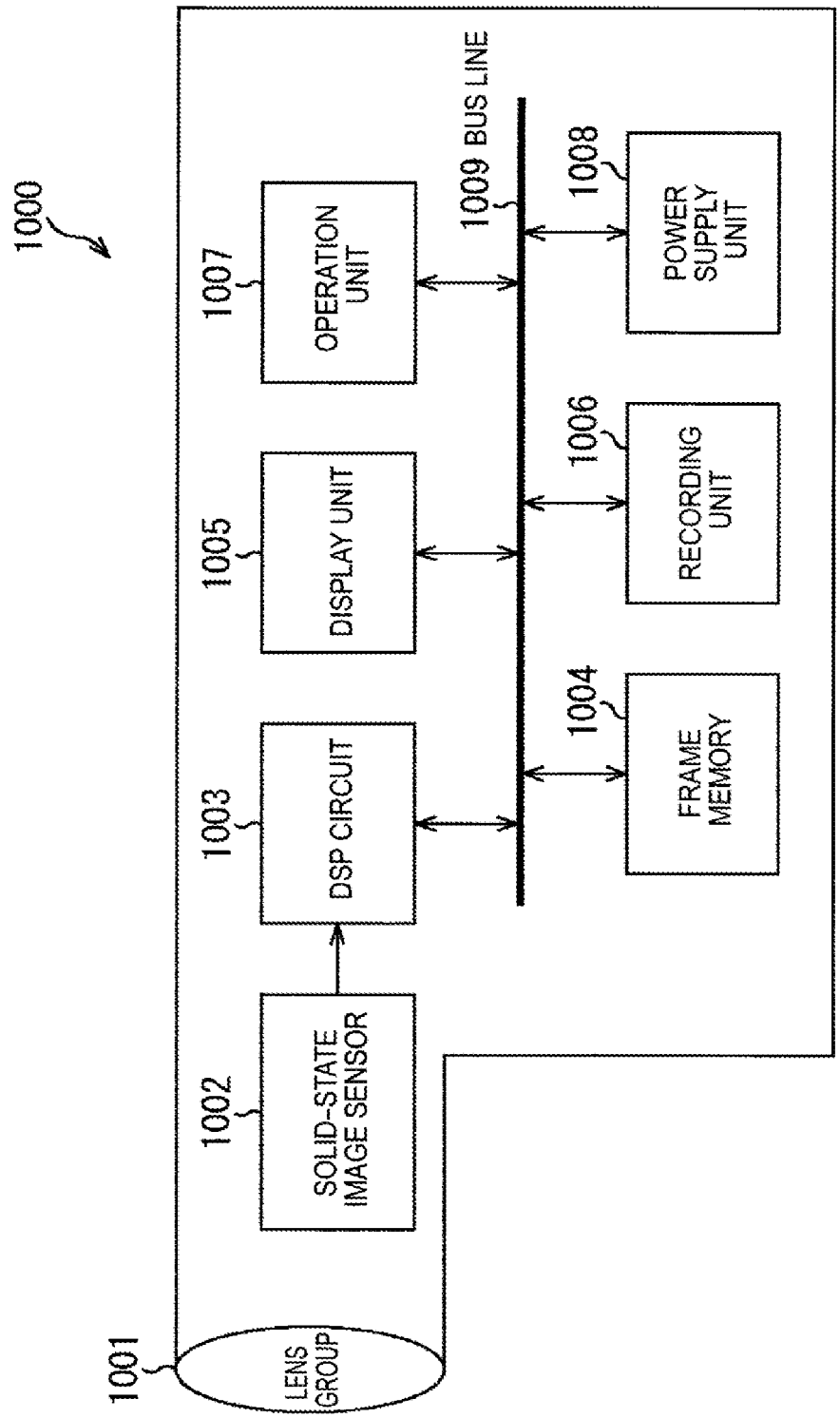
FIG. 19 is a block diagram illustrating an example configuration of an imaging device as an electronic appliance to which an embodiment of the present disclosure is applied.
Figure 20:
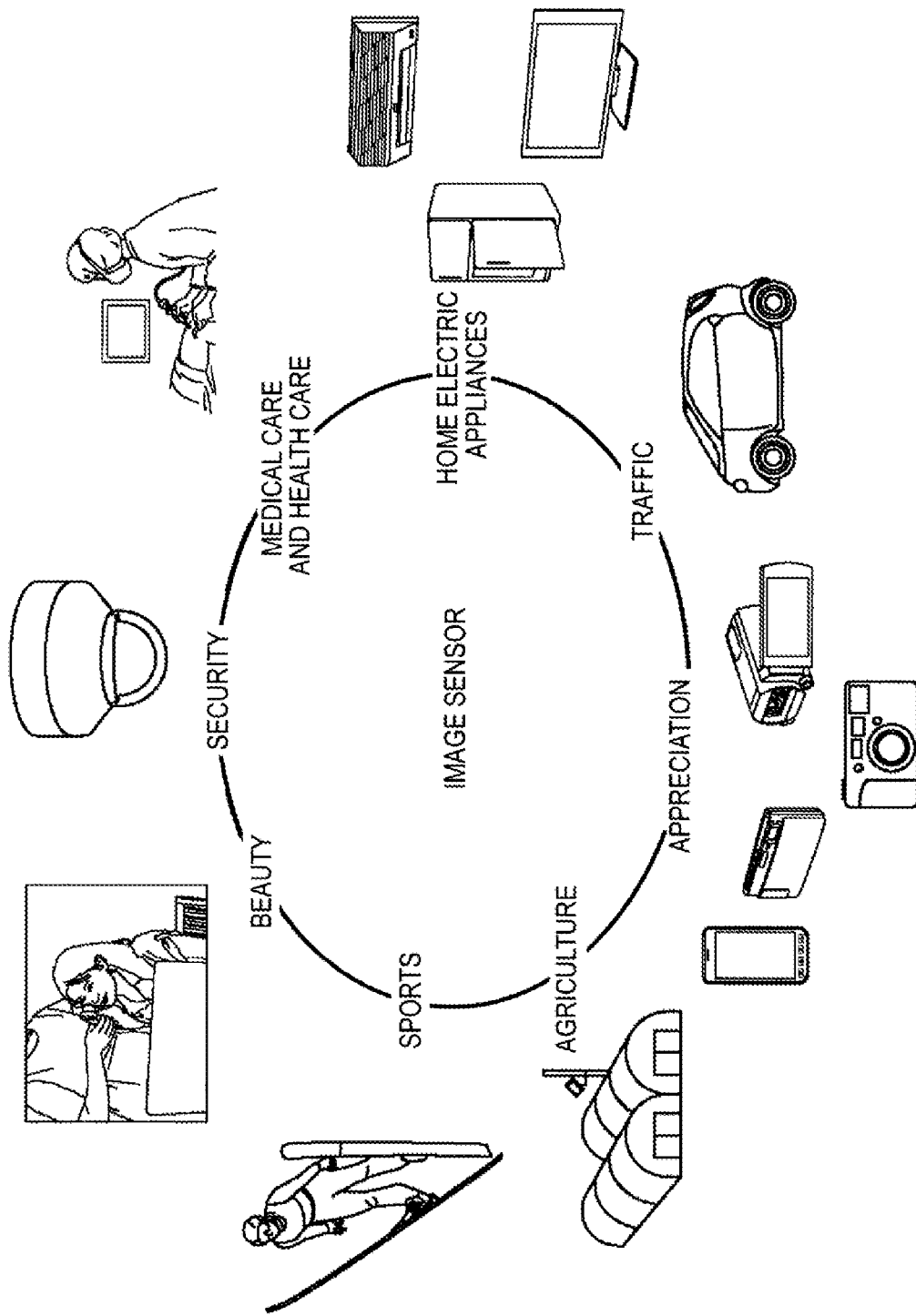
FIG. 20 is a view illustrating usage examples of the CMOS image sensor described above.

FIG. 19 is a block diagram illustrating an example configuration of an embodiment of an imaging device as an electronic appliance to which the present disclosure is applied.

An imaging device 1000 of FIG. 19 is a video camera, a digital still camera, or the like. The imaging device 1000 includes a lens group 1001, a solid-state image sensor 1002, a DSP circuit 1003, a frame memory 1004, a display unit 1005, a recording unit 1006, an operation unit 1007, and a power supply unit 1008. The DSP circuit 1003, the frame memory 1004, the display unit 1005, the recording unit 1006, the operation unit 1007, and the power supply unit 1008 are mutually connected via a bus line 1009.

The lens group 1001 takes in incident light (image light) from a photographic subject, and forms an image on an imaging surface of the solid-state image sensor 1002. The solid-state image sensor 1002 includes the CMOS image sensor 10 (140) described above. The solid-state image sensor 1002 converts the amount of incident light whose image is formed on the imaging surface by the lens group 1001 to electrical signals in units of pixels, and supplies the electrical signals as pixel signals to the DSP circuit 1003.

The DSP circuit 1003 performs predetermined image processing on the pixel signals supplied from the solid-state image sensor 1002, and supplies the pixel signals after the image processing to the frame memory 1004 in units of frames so that the pixel signals are temporarily stored.

The display unit 1005 is configured with, for example, a panel-type display device, such as a liquid crystal panel or an organic electro luminescence (EL) panel, and displays an image on the basis of the pixel signals in units of frames temporarily stored in the frame memory 1004.

The recording unit 1006 is configured with a digital versatile disk (DVD), a flash memory, or the like, and reads and records the pixel signals in units of frames temporarily stored in the frame memory 1004.

The operation unit 1007 issues, under control by a user, operation commands about various functions of the imaging device 1000. The power supply unit 1008 supplies power to the DSP circuit 1003, the frame memory 1004, the display unit 1005, the recording unit 1006, and the operation unit 1007 as appropriate.

An electronic appliance to which an embodiment of the present technology is applied may be any device that uses a CMOS image sensor in an image capturing unit (photoelectric conversion unit), examples of which include a portable terminal device having an imaging function and a copying machine using a CMOS image sensor in an image reading unit, in addition to the imaging device 1000.

<Usage Examples of CMOS Image Sensor>

FIG. 20 is a view illustrating usage examples of the CMOS image sensor 10 (140) described above.

The CMOS image sensor 10 (140) described above can be used in various cases of, for example, sensing light such as visible light, infrared light, ultraviolet light, and X-rays as is described below.

Devices that take images used for appreciation, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electric appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

Note that the effects described in the present specification are merely examples, and not limitative; other effects may be exhibited.

In addition, embodiments of the present disclosure are not limited to the above-described embodiments, and various alterations may occur insofar as they are within the scope of the present disclosure.

For example, an embodiment of the present technology can also be applied to a semiconductor device in which a plurality of semiconductor chips are flip-chip bonded to each other, other than a CMOS image sensor.

Additionally, the present technology may also be configured as below.

(1)

A semiconductor device including:

a plurality of bumps on a first semiconductor substrate; and a lens material in a region other than the plurality of bumps on the first semiconductor substrate, wherein a distance between a side of a bump closest to the lens material and a side of the lens material closest to the bump is greater than twice a diameter of the bump closest to the lens material, and wherein the distance between the side of the bump closest to the lens material and the side of the lens material closest to the bump is greater a minimum pitch of the bumps.

(2)

The semiconductor device according to (1), wherein the lens material is formed only in a pixel region on the first semiconductor substrate.

(3)

The semiconductor device according to (1), wherein the lens material is formed only in the region other than a region on the first semiconductor substrate that corresponds to a second semiconductor substrate configured to be bonded to the first semiconductor substrate via the bump.

(4)

The semiconductor device according to (3), wherein the lens material is formed to have an opening in a region on the first semiconductor substrate, the opening being larger than the second semiconductor substrate.

(5)

The semiconductor device according to (4), further including:

an under-fill resin formed between the second semiconductor substrate and the first semiconductor substrate; and a dam that is formed on the first semiconductor substrate and prevents leakage of the under-fill resin to a region other than a region to which the second semiconductor substrate is bonded on the first semiconductor substrate, wherein the lens material is formed to have an opening in a whole region inside the dam on the first semiconductor substrate.

(6)

The semiconductor device according to (3), further including:

an under-fill resin formed between the second semiconductor substrate and the first semiconductor substrate; and a dam that is formed on the first semiconductor substrate and prevents leakage of the under-fill resin to a region other than a region to which the second semiconductor substrate is bonded on the first semiconductor substrate, wherein the lens material is formed to have an opening in only a partial region inside the dam on the first semiconductor substrate.

(7)

The semiconductor device according to (3), wherein the lens material is formed to have an opening in a region on the first semiconductor substrate, the opening is smaller than the second semiconductor substrate.

(8)

The semiconductor device according to (1), wherein the side of the lens material closest to the bump is a side of an on-chip lens.

(9)

The semiconductor device according to (1), further including:

an electrode pad for bump connection formed on the first semiconductor substrate and configured to be connected to the bump; and an electrode pad for wire bonding formed on the first semiconductor substrate and configured to be connected to a wire bonding, wherein a ratio of a distance between a side of an opening portion for wire bonding closest to the lens material and a side of the lens material closest to the opening portion for wire bonding to a size of the opening portion for wire bonding is smaller than a ratio of a distance between a side of an opening portion for a bump closest to the lens material and a side of the lens material closest to the opening portion for a bump to a size of the opening portion for a bump.

(10)

A method of manufacturing a semiconductor device, the method including:

forming a plurality of bumps on a first semiconductor substrate, and forming a lens material in a region other than the plurality of bumps on the first semiconductor substrate, wherein a distance between a side of a bump closest to the lens material and a side of the lens material closest to the bump is greater than twice a diameter of the bump closest to the lens material, and wherein the distance between the side of the bump closest to the lens material and the side of the lens material closest to the bump is greater a minimum pitch of the bumps.

(11)

An electronic appliance including:

a plurality of bumps on a first semiconductor substrate; and a lens material in a region other than the plurality of bumps on the first semiconductor substrate, wherein a distance between a side of a bump closest to the lens material and a side of the lens material closest to the bump is greater than twice a diameter of the bump closest to the lens material, and wherein the distance between the side of the bump closest to the lens material and the side of the lens material closest to the bump is greater a minimum pitch of the bumps.

(12)

A semiconductor device including:

a first semiconductor substrate having a rectangular shape;

a second semiconductor substrate having a rectangular shape, wherein an area of the second semiconductor substrate is less than an area of the first semiconductor substrate and at least a region of a first edge of the second semiconductor substrate is flush with at least a region of a first edge of the first semiconductor substrate; and a third semiconductor substrate having a rectangular shape, wherein an area of the third semiconductor substrate is less than an area of the first semiconductor substrate and at least a region of a first edge of the third semiconductor substrate is flush with at least a region of a second edge of the first semiconductor substrate.

(13)

The semiconductor device according to (12), wherein the first semiconductor substrate includes an array of pixels, wherein the second and third semiconductor substrates each include at least one logic circuit, wherein each of the first edge of the first semiconductor substrate and the first edge of the second semiconductor substrate correspond to a scribe line forming a first edge of the stacked semiconductor device, and wherein each of the second edge of the first semiconductor substrate and the first edge of the third semiconductor substrate correspond to a scribe line forming a second edge of the stacked semiconductor device.

(14)

A method of manufacturing a semiconductor device, the method including:

bonding a first semiconductor substrate including a plurality of logic circuits to second and third semiconductor substrates arrayed in a semiconductor wafer, where each of the second and third semiconductor substrates includes a pixel array, and wherein the first semiconductor substrate spans the second and third semiconductor substrates; and cutting a first edge of the first semiconductor substrate and a first edge of the second semiconductor substrate such that the first edge of the first semiconductor substrate and the first edge of the second semiconductor substrate are flush with one another.

(15)

The method of manufacturing the semiconductor device according to (14), further including:

bonding a fourth semiconductor substrate including a plurality of logic circuits to the second semiconductor substrate and a fifth semiconductor substrate, wherein the fourth semiconductor substrate spans the second and fifth semiconductor substrates; and cutting a second edge of the second semiconductor substrate and a first edge of the fourth semiconductor substrate such that the second edge of the second semiconductor substrate and the first edge of the fourth semiconductor substrate are flush with one another.

(16)

An electronic appliance including:

a first semiconductor substrate having a rectangular shape;

a second semiconductor substrate having a rectangular shape, wherein an area of the second semiconductor substrate is less than an area of the first semiconductor substrate and at least a region of a first edge of the second semiconductor substrate is flush with at least a region of a first edge of the first semiconductor substrate; and a third semiconductor substrate having a rectangular shape, wherein an area of the third semiconductor substrate is less than an area of the first semiconductor substrate and at least a region of a first edge of the third semiconductor substrate is flush with at least a region of a second edge of the first semiconductor substrate.

(17)

A semiconductor device including:

a first semiconductor substrate including a plurality of on-chip lenses corresponding to a plurality of pixels; and a second semiconductor substrate mounted to a light incident side of the first semiconductor substrate via one or more soldier bumps, wherein a size of the first semiconductor substrate is greater than a size of the second semiconductor substrate, and wherein the second semiconductor substrate is configured to receive one or more pixel signals from the first semiconductor substrate, process the one or more pixel signals, and output the processed one or more pixel signals.

REFERENCE SIGNS LIST

10 CMOS image sensor
21 pixel region
11, 12 semiconductor chip
13 bump
52 electrode pad for wire bonding
53A electrode pad for bump connection
55 under-fill resin
56 dam
57 lens material
71 opening portion for a bump
72 opening portion for wire bonding
91 to 93 region
94 opening region
101 distance
102 diameter
103 minimum value
104 size
105 distance
120 wire bonding
123 size
124 distance
140 CMOS image sensor
141 lower chip
171 north chip
172 south chip
191 to 194 side

The invention claimed is:

1. A semiconductor device, comprising:
a first semiconductor substrate having a rectangular shape;
a second semiconductor substrate having a rectangular shape, wherein an area of the second semiconductor substrate is less than an area of the first semiconductor substrate and at least a region of a first edge of the second semiconductor substrate is flush with at least a region of a first edge of the first semiconductor substrate; and a third semiconductor substrate having a rectangular shape, wherein an area of the third semiconductor substrate is less than an area of the first semiconductor substrate and at least a region of a first edge of the third semiconductor substrate is flush with at least a region of a second edge of the first semiconductor substrate, wherein the first semiconductor substrate includes a plurality of arrays of pixels, wherein a first one of the plurality of arrays of pixels is adjacent to at least a portion of the second semiconductor substrate, and wherein a second one of the plurality of arrays of pixels is adjacent to at least a portion of the third semiconductor substrate.

2. The semiconductor device according to claim 1, wherein the second semiconductor substrate includes a processing circuit.

3. The semiconductor device according to claim 2, wherein the first semiconductor substrate further includes a peripheral circuit.

4. The semiconductor device according to claim 1, wherein the first semiconductor substrate is connected to the second and third semiconductor substrates by bumps.

5. The semiconductor device according to claim 4, wherein the first semiconductor substrate further includes a plurality of electrodes.

6. The semiconductor device according to claim 5, wherein the second semiconductor substrate includes a first test element group pattern that is connected to at least a first one of the bumps, and wherein the third semiconductor substrate includes a second test element group pattern that is connected to at least a second one of the bumps.

7. The semiconductor device according to claim 5, wherein the plurality of electrodes are formed in an area outside of an area of the second semiconductor substrate and outside of an area of the third semiconductor substrate.

8. The semiconductor device according to claim 1,
wherein the second and third semiconductor substrates each include at least one logic circuit,
wherein the semiconductor device is a stacked semiconductor device,
wherein each of the first edge of the first semiconductor substrate and the first edge of the second semiconductor substrate correspond to a scribe line forming a first edge of the stacked semiconductor device, and
wherein each of the second edge of the first semiconductor substrate and the first edge of the third semiconductor substrate correspond to a scribe line forming a second edge of the stacked semiconductor device.

9. The semiconductor device according to claim 8, further comprising:

a fourth semiconductor substrate having a rectangular shape, wherein an area of the fourth semiconductor substrate is less than an area of the first semiconductor substrate and at least a region of a first edge of the fourth semiconductor substrate is flush with at least a region of the first edge of the first semiconductor substrate; and a fifth semiconductor substrate having a rectangular shape, wherein an area of the fifth semiconductor substrate is less than an area of the first semiconductor substrate and at least a region of a first edge of the fifth semiconductor substrate is flush with at least a region of the second edge of the first semiconductor substrate.

10. The semiconductor device according to claim 9, further comprising:

a sixth semiconductor substrate having a rectangular shape, wherein an area of the sixth semiconductor substrate is less than an area of the first semiconductor substrate and at least a region of a first edge of the sixth semiconductor substrate is flush with at least a region of the first edge of the first semiconductor substrate; and a seventh semiconductor substrate having a rectangular shape, wherein an area of the seventh semiconductor substrate is less than an area of the first semiconductor substrate and at least a region of a first edge of the seventh semiconductor substrate is flush with at least a region of the second edge of the first semiconductor substrate.

11. The semiconductor device according to claim 8, wherein alignment marks are formed on the first semiconductor substrate.

* * * * *